(12) United States Patent
Shigihara

(10) Patent No.: US 9,203,216 B2
(45) Date of Patent: Dec. 1, 2015

(54) SEMICONDUCTOR LASER DEVICE

(71) Applicant: Mitsubishi Electric Corporation, Tokyo (JP)

(72) Inventor: Kimio Shigihara, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 14/108,452

(22) Filed: Dec. 17, 2013

(65) Prior Publication Data

US 2014/0294028 A1    Oct. 2, 2014

(30) Foreign Application Priority Data

Mar. 29, 2013   (JP) ................. 2013-072302

(51) Int. Cl.
  *H01S 5/00*  (2006.01)
  *H01S 5/20*  (2006.01)
  *H01S 5/22*  (2006.01)

(52) U.S. Cl.
  CPC ............. *H01S 5/2027* (2013.01); *H01S 5/2031* (2013.01); *H01S 5/2036* (2013.01); *H01S 5/22* (2013.01)

(58) Field of Classification Search
  CPC ........... H01S 5/22; H01S 5/2031; H01S 5/20; H01S 5/2027; H01S 5/2036
  USPC ................. 372/45.01, 43.01, 44.011
  See application file for complete search history.

(56) References Cited

U.S. PATENT DOCUMENTS

| | | | |
|---|---|---|---|
| 8,111,726 B2 * | 2/2012 | Shigihara ................... | 372/45.01 |
| 2001/0009558 A1 * | 7/2001 | Shigihara ...................... | 372/45 |
| 2004/0047378 A1 | 3/2004 | Erbert et al. | |
| 2012/0263205 A1 | 10/2012 | Gomez-Iglesias et al. | |

FOREIGN PATENT DOCUMENTS

| | | |
|---|---|---|
| DE | 100 46 580 A1 | 4/2002 |
| DE | 10 2009 041 934 A1 | 3/2011 |
| JP | 8-195529 A | 7/1996 |
| JP | 11-233882 A | 8/1999 |
| JP | 2000-151018 A | 5/2000 |
| JP | 2007-220692 A | 8/2007 |

OTHER PUBLICATIONS

M. Alam et al.; "Simple Analysis of Carrier Transport and Buildup in Separate Confinement Heterostructure Quantum Well Lasers", *IEEE Photonics Tech. Letters*, vol. 6, No. 12, pp. 1418-1420. (Dec. 1994).
K. Iga et al.; "Semiconductor Lasers", *Ohmsha, Ltd.*, pp. 35-38, (Oct. 25, 1994).
German Patent Office; Office Action in German Patent Application No. 10 2014 204 938.5 (Apr. 20, 2015).

* cited by examiner

*Primary Examiner* — Jessica Stultz
*Assistant Examiner* — Delma R Forde
(74) *Attorney, Agent, or Firm* — Leydig, Voit & Mayer, Ltd.

(57) ABSTRACT

A semiconductor laser device includes an n-type semiconductor substrate, an n-type cladding layer laminated on the semiconductor substrate, an n-side light guiding layer laminated on the n-type cladding layer, an active layer laminated on the n-side light guiding layer, a p-side light guiding layer laminated on the active layer, and a p-type cladding layer laminated on the p-side light guiding layer. The sum of the thicknesses of the n-side and p-side light guiding layers is such that the first and higher order modes of oscillation can occur in the crystal growth direction. A low refractive index layer having a lower refractive index than the n-type cladding layer is located between the n-side light guiding layer and the n-type cladding layer, and the active layer is displaced from the lateral center plane of the light guiding layer structure toward the p-type cladding layer.

2 Claims, 17 Drawing Sheets

SEMICONDUCTOR LASER DEVICE

BACKGROUND OF THE INVENTION

1. Field of the Invention

The present invention relates to a semiconductor laser device.

2. Background Art

Semiconductor laser devices configured to have a relatively narrow far field pattern (FFP) have been known, as disclosed, e.g., in Japanese Laid-Open Patent Publication No. H11-233882. Specifically, this publication discloses a semiconductor laser in which an n-side (or first conductivity type side) low refractive index layer is provided between an n-type cladding layer and an n-side light guiding layer, with the n-side low refractive index layer having a lower refractive index than the n-type cladding layer. This configuration allows for widening the optical intensity distribution in the crystal growth direction and thereby narrowing the far field pattern (FFP) of the semiconductor laser.

Other prior art includes Japanese Unexamined Patent Application Publication No. H11-233882, Japanese Laid-Open Patent Publication No. 2000-151018, Japanese Laid-Open Patent Publication No. 2007-220692, Japanese Laid-Open Patent Publication No. H8-195529.

Other prior art includes a non-patent publication M. Alam and M. Lundstrom, "Simple Analysis of Carrier Transport and Buildup in Separate Confinement Heterostructure Quantum Well Lasers", IEEE, Pnotonics Tecnol. Lett., Vol. 6, No. 12, pp. 1418-1420, 1994. Other prior art also includes a non-patent publication Iga, "Semiconductor Laser", pp. 35-38, Oct. 25, 1994, Ohmsha, Ltd.

However, the above conventional semiconductor laser device is disadvantageous in that the width of the near field pattern (NFP), or near field intensity profile, of the laser beam as measured in the crystal growth direction is relatively large, since the low refractive index layer having a lower refractive index than the n-type cladding layer is provided between the n-type cladding layer and the n-side light guiding layer. This reduces the optical confinement factor in the active layer, resulting in an increased threshold current of the semiconductor laser device.

In conventional semiconductor laser devices, the active layer may be displaced from the lateral center plane of the light guiding layer structure (which is formed of the n-side and p-side light guiding layers with the active layer sandwiched therebetween) toward the p-type cladding layer in order to improve the slope efficiency. This configuration, however, results in an increased threshold current of the semiconductor laser device.

SUMMARY OF THE INVENTION

The present invention has been made to solve the above problems. It is, therefore, an object of the present invention to provide a semiconductor laser device having a low threshold current, high slope efficiency, and high power conversion efficiency.

According to one aspect of the present invention, a semiconductor laser device includes: a semiconductor substrate of a first conductivity type; a cladding layer of the first conductivity type laminated on the semiconductor substrate; a first light guiding layer laminated on the cladding layer of the first conductivity type; an active layer laminated on the first light guiding layer; a second light guiding layer laminated on the active layer; and a cladding layer of a second conductivity type laminated on the second light guiding layer. Wherein, a sum of thickness of the first light guiding layer and thickness of the second light guiding layer is such that first and higher order modes of oscillation can occur in crystal growth direction. Wherein, the thickness of the first light guiding layer is greater than the thickness of the second light guiding layer. Wherein, a first low refractive index layer having a refractive index lower than that of the cladding layer of the first conductivity type is provided between the cladding layer of the first conductivity type and the first light guiding layer.

According to another aspect of the present invention, a semiconductor laser device includes: a semiconductor substrate of a first conductivity type; a cladding layer of the first conductivity type laminated on the semiconductor substrate; a first light guiding layer laminated on the cladding layer of the first conductivity type; an active layer laminated on the first light guiding layer; a second light guiding layer laminated on the active layer; and a cladding layer of a second conductivity type laminated on the second light guiding layer. Wherein, a sum of thickness of the first light guiding layer and thickness of the second light guiding layer is such that first and higher order modes of oscillation can occur in crystal growth direction. Wherein, the thickness of the first light guiding layer is greater than the thickness of the second light guiding layer. Wherein, a first low refractive index layer having a refractive index lower than that of the cladding layer of the first conductivity type is provided between the cladding layer of the first conductivity type and the first light guiding layer. Wherein, a second low refractive index layer having a refractive index lower than that of the cladding layer of the second conductivity type is provided between the second light guiding layer and the cladding layer of the second conductivity type. Wherein, a product of thickness of the first low refractive index layer and a square root of difference between a square of the refractive index of the cladding layer of the first conductive type and a square of the refractive index of the first low refractive index layer is greater than a product of thickness of the second low refractive index layer and a square root of difference between a square of the refractive index of the cladding layer of the second conductivity type and a square of the refractive index of the second low refractive index layer.

According to further another aspect of the present invention, a semiconductor laser device includes: a semiconductor substrate of a first conductivity type; a cladding layer of the first conductivity type laminated on the semiconductor substrate; a first light guiding layer laminated on the cladding layer of the first conductivity type; an active layer laminated on the first light guiding layer; a second light guiding layer laminated on the active layer; and a cladding layer of a second conductivity type laminated on the second light guiding layer. Wherein, a sum of thickness of the first light guiding layer and thickness of the second light guiding layer is such that first and higher order modes of oscillation can occur in crystal growth direction. Wherein, the thickness of the first light guiding layer is greater than the thickness of the second light guiding layer. Wherein, a low refractive index layer having a refractive index lower than that of the cladding layer of the first conductivity type is provided between the cladding layer of the first conductivity type and the first light guiding layer. Wherein, a high refractive index layer having a refractive index lower than that of the active layer but higher than that of the second light guiding layer is provided between the second light guiding layer and the cladding layer of the second conductivity type.

Other and further objects, features and advantages of the invention will appear more fully from the following description.

DETAILED DESCRIPTION OF THE PREFERRED EMBODIMENTS

The following description of semiconductor laser devices sometimes refers to cross-sectional views, and a system of x, y, and z coordinate axes is shown in these cross-sectional views for convenience of orientation, wherein the y-axis corresponds to the crystal growth direction of the semiconductor layers of the semiconductor laser device, the z-axis corresponds to the depth direction of the semiconductor laser device, that is, the direction of the length of the resonator defined by the front and rear facets of the semiconductor laser device, and the x-axis corresponds to the width direction of the semiconductor laser device.

First Embodiment

Explanation of Number of Possible Modes

Figure 1:
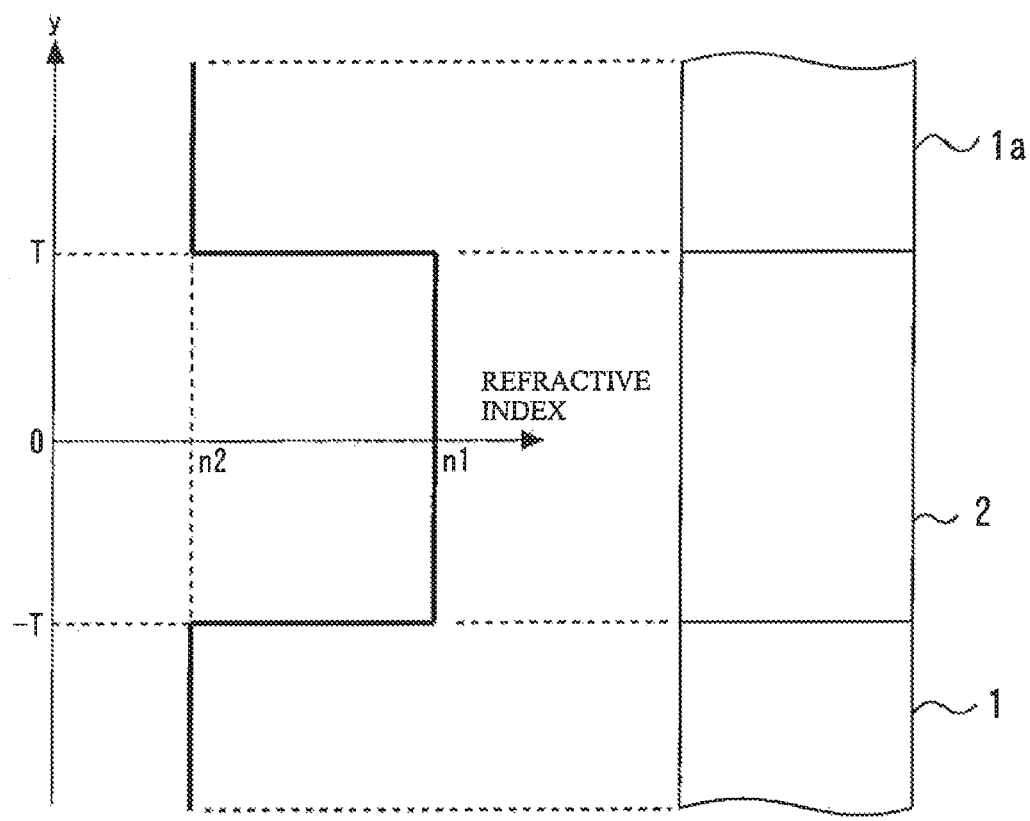
FIG. 1 is a diagram showing a layer structure of a semiconductor laser device, and will be used to describe a first embodiment of the present invention.

The number of modes of oscillation that can occur in the resonator of a semiconductor laser device in the crystal growth direction will be briefly described with reference to FIG. 1. FIG. 1 is a diagram showing a layer structure of a semiconductor laser device, and will be used to describe a first embodiment of the present invention. This layer structure includes layers stacked in the crystal growth direction of the semiconductor laser device. Specifically, the layer structure shown in FIG. 1 includes a low refractive index layer (or n-type cladding layer) 1 of refractive index n2, a low refractive index layer (or p-type cladding layer) 1a of refractive index n2, and a high refractive index layer 2 of refractive index n1 sandwiched between these low refractive index layers and serving as a light guiding layer.

The three-layer structure is schematically shown in the right hand side of FIG. 1, and the refractive indices of the three semiconductor layers of the structure are schematically indicated in the left hand side of FIG. 1. As described above, the low refractive index layers 1 and 1a have the same refractive index (n2). The high refractive index layer 2 has refractive index n1, which is greater than refractive index n2.

The high refractive index layer 2 is configured as a typical high refractive index layer, and the light confinement factor and the number of modes of oscillation in the high refractive index layer 2 are determined by the normalized frequency, or v-value, calculated from Equation (1) described later. In the Equation (1), λ is the wavelength of light in the high refractive index layer 2 and T is one half of the thickness of the high refractive index layer 2. The number of modes of oscillation in the high refractive index layer 2 increases with the v-value. Specifically, when the v-value is $\pi/2$ or more, the first and higher order modes of oscillation (in addition to the fundamental mode of oscillation) can occur in the high refractive index layer 2.

It should be noted that in the semiconductor laser devices of this and subsequent embodiments described herein, the light guiding layers and other semiconductor layers (constituting a light guiding layer structure) have a sufficient combined thickness so that the first and higher order modes of oscillation can occur in the resonator. That is, the semiconductor laser device of each of these embodiments is configured so that the v-value is $\pi/2$ or more.

As can be seen from the following Equation (1), when the refractive index of the high refractive index layer 2 is close to that of the low refractive index layers 1 and 1a (that is, n1≈n2), the v-value is proportional to the square root of Δn and to the thickness T of the high refractive index layer, where Δn is the difference between the refractive index of the high refractive index layer 2 and that of the low refractive index layers 1 and 1a.

$$v \equiv \frac{2\pi}{\lambda} \sqrt{n_1^2 - n_2^2} \, T \qquad (1)$$

$$= \frac{2\pi}{\lambda} \sqrt{(n_1 + n_2)(n_1 - n_2)} \, T$$

$$\approx \frac{2\pi}{\lambda} \sqrt{2n_2 \Delta n} \, T, \, \Delta n \equiv n_1 - n_2$$

Configuration and Operation of Device of First Embodiment

First Practical Example of First Embodiment

Figure 2:
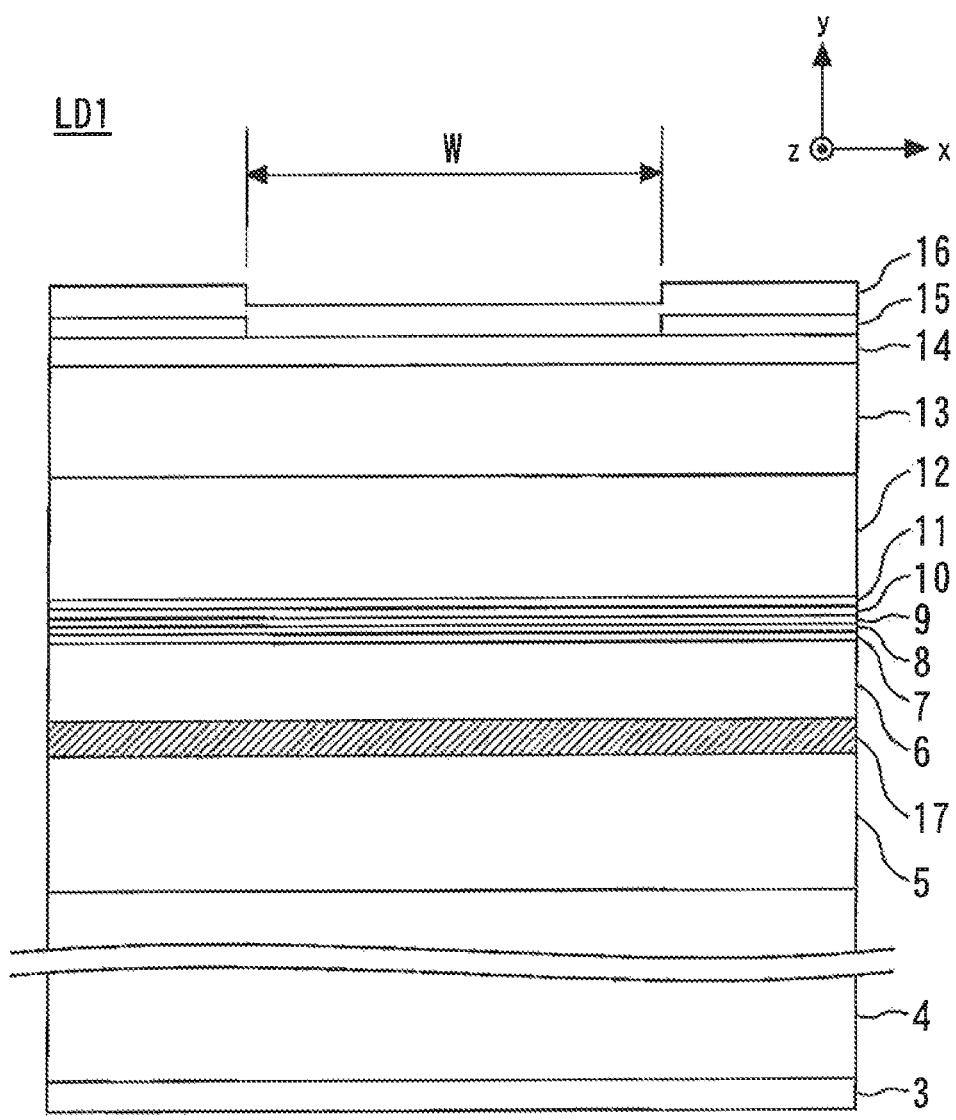
FIG. 2 is a cross-sectional view of a semiconductor laser device in accordance with a first practical example of the first embodiment.

FIG. 2 is a cross-sectional view of a semiconductor laser device LD1 in accordance with a first practical example of the first embodiment. The semiconductor laser device LD1 is of the so-called Fabry-Perot type. The cross-sectional structure shown in FIG. 2 extends along the entire length of the semiconductor laser device LD1 in the z-axis direction (perpendicular to the plane of the paper in FIG. 2).

The semiconductor laser device LD1 has a cleaved facet at each of the opposite ends thereof, which face in the z-axis direction. One of these cleaved facets serves as a front facet for emitting laser light generated in the semiconductor laser device LD1, and the other cleaved facet serves as a rear facet. The front and rear facets have formed thereon an antireflective film and a protective film, each of which has a suitable thickness. The front and rear facets define, with a plurality of semiconductor layers, a resonator having a length extending between the front and rear facets.

The semiconductor laser device LD1 includes an n-type GaAs substrate 4 having an n-type electrode 3 on its bottom surface. A plurality of semiconductor layers are grown in crystalline form on the n-type GaAs substrate 4. These semiconductor layers include an n-type AlGaAs cladding layer 5, an n-side AlGaAs light guiding layer 6, an n-side AlGaAs barrier layer 7, an InGaAs quantum well layer 8, an AlGaAs barrier layer 9, an InGaAs quantum well layer 10, a p-side AlGaAs barrier layer 11, a p-side AlGaAs light guiding layer 12, a p-type AlGaAs cladding layer 13, and a p-type GaAs contact layer 14. It should be noted that the quantum well layers 8 and 10 and the barrier layers 7, 9, and 11 form an active layer sandwiched between the light guiding layers 6 and 12, and that the light guiding layers 6 and 12 and the active layer form a light guiding layer structure. The thickness of this light guiding layer structure is substantially equal to the sum of the thicknesses of the light guiding layers 6 and 12.

The n-type AlGaAs cladding layer 5 has an Al mole fraction of 0.250 and a thickness of 1.5 μm. The n-side AlGaAs light guiding layer 6 has an Al mole fraction of 0.183 and a thickness of 465 nm. The n-side AlGaAs barrier layer 7 has an Al mole fraction of 0.100 and a thickness of 10 nm. The InGaAs quantum well layer 8 has an In mole fraction of 0.138 and a thickness of 8 nm.

The AlGaAs barrier layer 9 has an Al mole fraction of 0.100 and a thickness of 3 nm. The InGaAs quantum well layer 10 has an In mole fraction of 0.138 and a thickness of 8 nm. The p-side AlGaAs barrier layer 11 has an Al mole fraction of 0.100 and a thickness of 10 nm.

The p-side AlGaAs light guiding layer 12 has an Al mole fraction of 0.183 and a thickness of 465 nm. The p-type AlGaAs cladding layer 13 has an Al mole fraction of 0.250 and a thickness of 1.5 μm. The p-type GaAs contact layer 14 has a thickness of 0.2 μm.

An SiN film 15 and a p-type electrode 16 are provided on the p-type GaAs contact layer 14. The SiN film 15 has a thickness of 0.2 μm. The SiN film 15 does not cover a longitudinal central portion of the surface of the p-type GaAs contact layer 14, which portion has a width of W. The p-type electrode 16 is formed to directly cover this exposed portion, thereby forming a stripe structure (or current constriction structure) having the same width (W) as that portion.

An n-side AlGaAs low refractive index layer 17 is provided between the n-type AlGaAs cladding layer 5 and the n-side AlGaAs light guiding layer 6. The n-side AlGaAs low refractive index layer 17 has an Al mole fraction of 0.500 and a thickness t1. The laser light emitted from the quantum well layers 8 and 10, which have an In mole fraction of 0.138 and a thickness of 8 nm, has a wavelength of 980 nm. At that wavelength, an AlGaAs layer having an Al mole fraction of 0.100 (such as the n-side AlGaAs barrier layer 7, the AlGaAs barrier layer 9, and the p-side AlGaAs barrier layer 11) has a refractive index of 3.455246, an AlGaAs layer having an Al mole fraction of 0.500 (such as the n-side AlGaAs low refractive index layer 17) has a refractive index of 3.217492, and an InGaAs layer having an In mole fraction of 0.138 (such as the InGaAs quantum well layers 8 and 10) has a refractive index of 3.543268.

The present inventor has examined semiconductor laser structures having light guiding layers which have a sufficient combined thickness so that the first and higher order modes of oscillation (in addition to the fundamental mode of oscillation) can occur in the resonator. This examination has led to the discovery that interposing between the n-type cladding layer and the n-side light guiding layer a low refractive index layer having a lower refractive index than the n-type cladding layer has the following four effects:

A first effect is that the near field pattern (NFP), or near field intensity profile, is narrowed, resulting in an increased optical confinement factor in the active layer.

A second effect is that the far field pattern (FFP) is widened.

A third effect is that the maximum intensity point in the light guiding layer structure is displaced from the lateral or longitudinal center plane of the light guiding layer structure toward the p-type cladding layer.

A fourth effect is that the maximum intensity in the light guiding layer structure is increased.

In the semiconductor laser device LD1 of the first practical example of the first embodiment, the n-type cladding layer and the p-type cladding layer are formed of AlGaAs with an Al mole fraction of 0.250 and the n-side light guiding layer and the p-side light guiding layer are formed of AlGaAs with an Al mole fraction of 0.183. In such semiconductor laser devices, when the sum of the thicknesses of the n-side and p-side light guiding layers is 929.7 nm, the v-value given by Equation (1) above is m/2. It should be noted that when the v-value is m/2, the first order mode of oscillation (in addition to the fundamental mode of oscillation) can occur in the resonator.

Further, in the semiconductor laser device LD1, InGaAs quantum well layers, and barrier AlGaAs layers having an Al mole fraction of 0.100, are disposed between the n-side and p-side light guiding layers. These quantum well layers and barrier layers have a higher refractive index than the n-side and p-side light guiding layers. This means that the first and higher order modes of oscillation can occur if the sum of the thicknesses of the n-side and p-side light guiding layers is at least 929.7 nm.

Figure 3A:
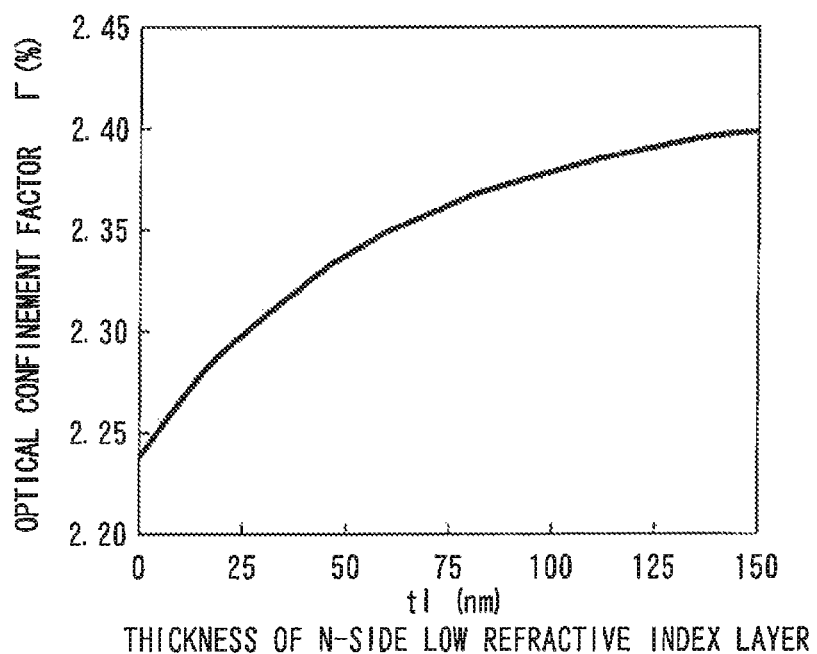
FIG. 3 includes FIGS. 3A and 3B showing advantageous characteristics of the semiconductor laser device of the first embodiment.
Figure 3B:
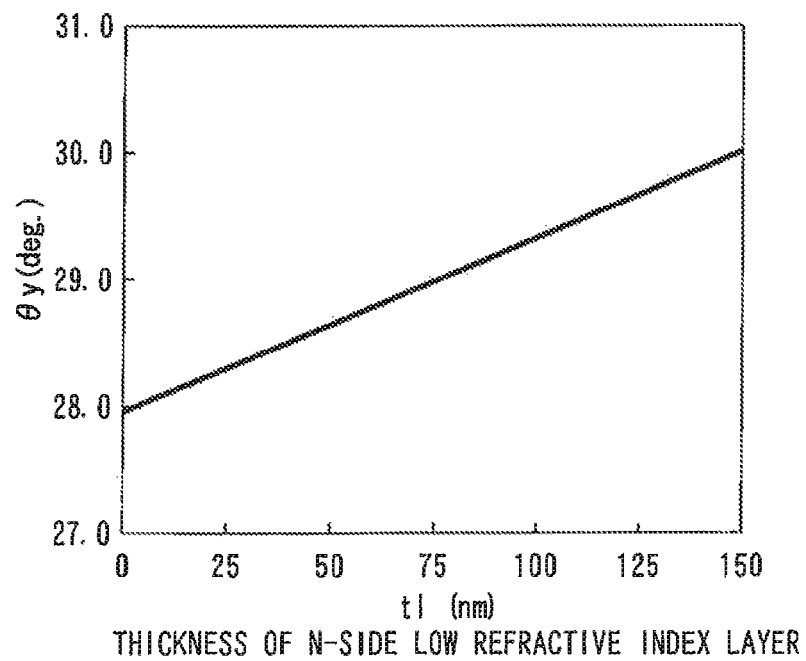

The following description will be directed to characteristics of the semiconductor laser device LD1 as a function of the thickness t1 of the n-side AlGaAs low refractive index layer, wherein the n-side and p-side light guiding layers have a thickness of 465 nm (as described above). FIG. 3 includes FIGS. 3A and 3B showing advantageous characteristics of the semiconductor laser device LD1 of the first embodiment.

FIG. 3A is a diagram showing how the optical confinement factor of the fundamental mode in the active layer of the semiconductor laser device LD1 of the first practical example depends on the thickness of the n-side AlGaAs low refractive index layer 17. Specifically, FIG. 3A shows the optical confinement factor F of the fundamental mode in the InGaAs quantum well layers 8 and 10 as a function of the thickness t1 of the n-side AlGaAs low refractive index layer 17.

As shown, the optical confinement factor gradually increases with increasing thickness of the low refractive index layer. This phenomenon is contrary to what has been found in the prior art and results from the narrowed NFP (or near field intensity profile) due to the presence of the n-side AlGaAs low refractive index layer 17.

FIG. 3B is a diagram showing how a feature of the far field pattern (FFP) of the semiconductor laser device LD1 of the first practical example depends on the thickness of the n-side AlGaAs low refractive index layer 17. Specifically, FIG. 3B shows the divergence angle (full-width at half-maximum) θy of the FFP in the crystal growth direction as a function of the thickness of the n-side AlGaAs low refractive index layer 17. As shown, the divergence angle θy gradually increases (i.e., the FFP gradually widens) with increasing thickness of the low refractive index layer. This also indicates that the near field pattern (NFP), or near field intensity profile, is narrowed due to the presence of the n-side AlGaAs low refractive index layer 17.

This NFP characteristic is opposite to that of the comparative conventional semiconductor laser device shown in FIG. 15 (described later), which is configured so that only the fundamental mode of oscillation can occur in the resonator. That is, in semiconductor laser devices such as the semiconductor laser device LD1 of the first embodiment in which the sum of the thicknesses of the light guiding layers is great enough that the first and higher order modes of oscillation can occur, the optical confinement factor in the active layer can be increased by interposing an n-side low refractive index layer between the n-type cladding layer and the n-type side light guiding layer. This results in a reduced threshold current of the semiconductor laser device.

Second Practical Example of First Embodiment

Figure 4:
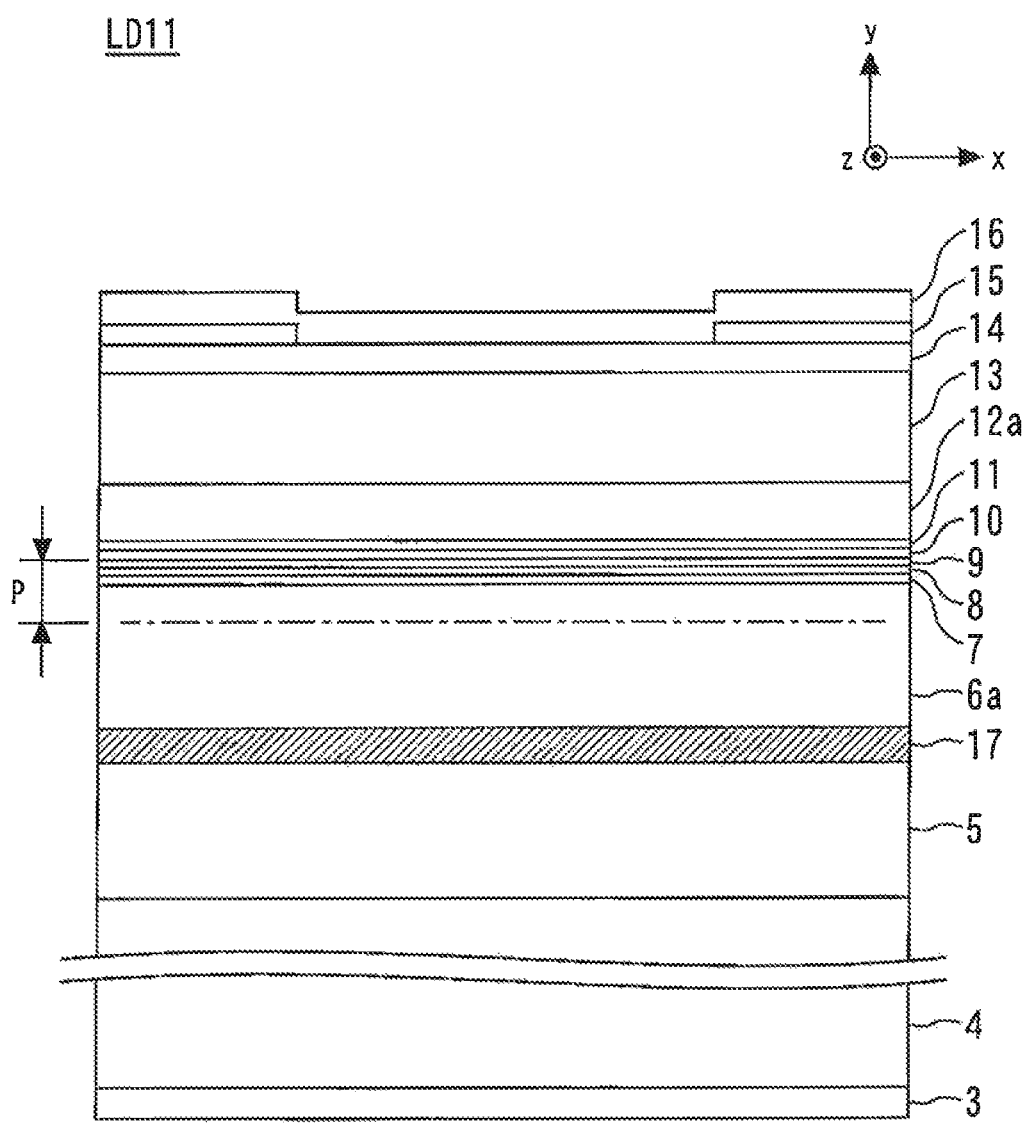
FIG. 4 is a cross-sectional view of a semiconductor laser device in accordance with a second practical example of the first embodiment.

FIG. 4 is a cross-sectional view of a semiconductor laser device LD11 in accordance with a second practical example of the first embodiment. This semiconductor laser device LD11 differs from the semiconductor laser device LD1 of the first practical example in that it includes an n-side AlGaAs light guiding layer 6a and a p-side AlGaAs light guiding layer 12a instead of the n-side AlGaAs light guiding layer 6 and the p-side AlGaAs light guiding layer 12. The sum of the thickness tgn of the n-side AlGaAs light guiding layer 6a and the thickness tgp of the p-side AlGaAs light guiding layer 12a is 930 nm.

However, the ratio of the thickness tgn and the thickness tgp may be varied to vary the position of the active layer relative to the lateral center plane of the light guiding layer structure (which is formed of the n-side light guiding layer 6a and the p-side light guiding layer 12a with the active layer sandwiched therebetween). The center position of the AlGaAs barrier layer 9 (which is disposed between the InGaAs quantum well layers 8 and 10) relative to the lateral center plane of the light guiding layer structure is referred to herein as the active layer position P. The lateral center plane of the light guiding layer structure is indicated by a chain line in FIG. 4, and the active layer position P is located in this plane when tgn=tgp=465 nm.

Changing the ratio of the thicknesses tgn and tgp results in displacement of the active layer position P toward or away from the p-type AlGaAs cladding layer 13 (i.e., upward or downward in FIG. 4). Except for this feature, the semiconductor laser device LD11 is similar to the semiconductor laser device LD1 of the first practical example shown in FIG. 2; for example, the Al mole fraction or In mole fraction of each layer of the semiconductor laser device LD11 is the same as that of the corresponding layer of the semiconductor laser device LD1.

Figure 5:
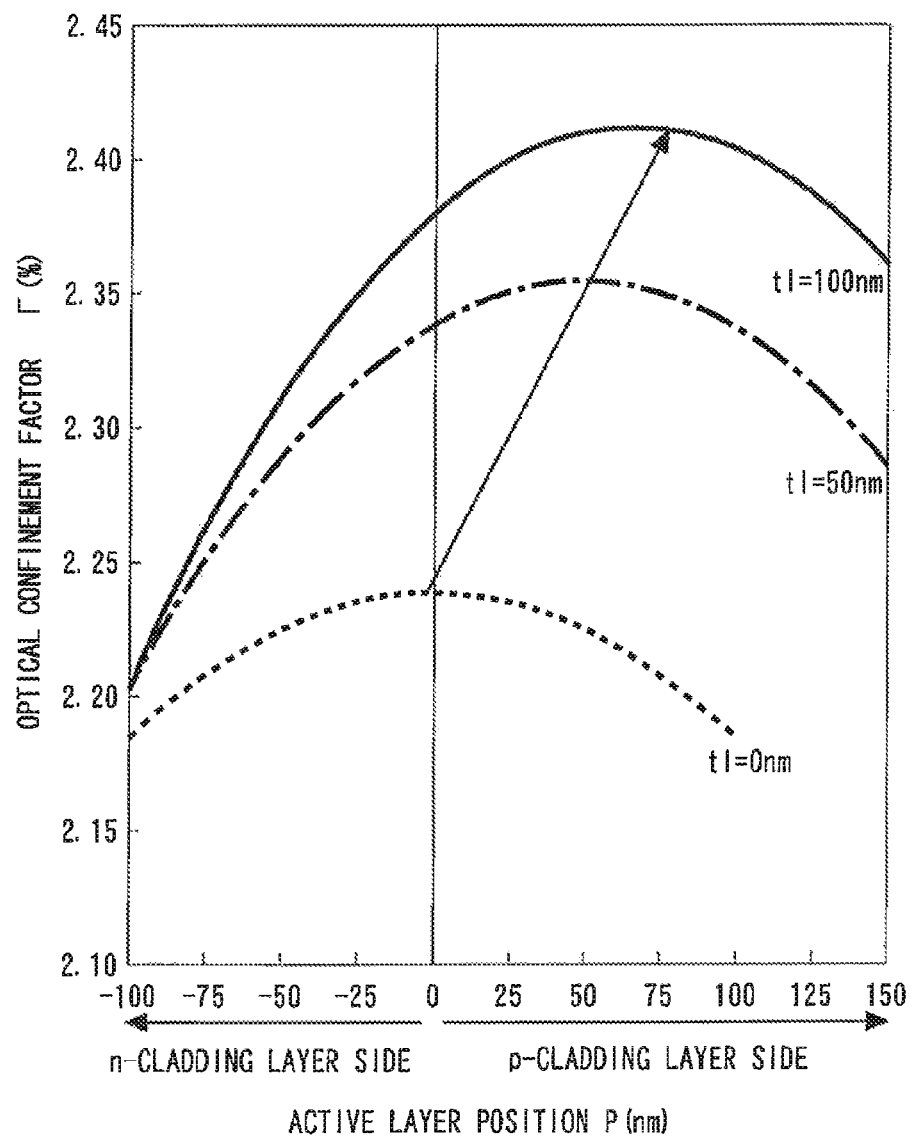
FIG. 5 is a diagram showing how the optical confinement factor of the fundamental mode in the active layer of the semiconductor laser device of the second practical example depends on the position of the active layer.

FIG. 5 is a diagram showing how the optical confinement factor of the fundamental mode in the active layer of the semiconductor laser device LD11 of the second practical example depends on the position of the active layer. Specifically, FIG. 5 shows the optical confinement factor F of the fundamental mode in the active layer as a function of the active layer position P, for different thicknesses t1 of the n-side AlGaAs low refractive index layer 17.

In FIG. 5, the simple dashed line represents the optical confinement factor when t1=0 nm, that is, when the n-side AlGaAs low refractive index layer 17 is absent. In this case, as shown in FIG. 5, the optical confinement factor is maximized when the active layer position P is located in the lateral center plane of the light guiding layer structure (P=0 nm) The optical confinement factor decreases from the maximum value in the same manner both when the active layer is displaced from the lateral center plane of the light guiding layer structure toward the n-type cladding layer and when it is displaced toward the p-type cladding layer.

The chain single-dashed line (or chain line) in FIG. 5 represents the optical confinement factor when the n-side AlGaAs low refractive index layer 17 has a thickness of 50 nm. As shown, the position of the active layer at which the optical confinement factor in the active layer is maximized is displaced toward the p-type cladding layer, and furthermore the maximum value of the optical confinement factor is increased, by the addition of the n-side AlGaAs low refractive index layer 17.

The solid line in FIG. 5 represents the optical confinement factor when the n-side AlGaAs low refractive index layer 17 has a thickness of 100 nm. As shown, the position of the active layer at which the optical confinement factor in the active layer is maximized is further displaced toward the p-type cladding layer and the maximum value of the optical confinement factor is further increased, as compared to when the n-side AlGaAs low refractive index layer 17 has a thickness of 50 nm.

The slope efficiency of the semiconductor laser device can be improved by displacing the active layer from the lateral center plane of the light guiding layer structure toward the p-type cladding layer. (It should be noted that the light guiding layer structure is made up of the n-side and p-side light guiding layers 6a and 12a with the active layer sandwiched therebetween.)

In the above embodiment, the active layer is displaced from the lateral center plane of the light guiding layer structure toward the p-type cladding layer (i.e., upward in FIG. 4), with the lateral center plane being represented by a chain line in FIG. 4. In the graph of FIG. 5, the horizontal axis represents the active layer position P relative to the lateral center plane of the light guiding layer structure, and greater values on the horizontal axis indicate shorter distances from the p-type cladding layer.

As described above, in the first embodiment, a low refractive index layer having a lower refractive index than the n-type cladding layer is provided between the n-side light guiding layer and the n-type cladding layer, and the active layer is displaced from the lateral center plane of the light guiding layer structure toward the p-type cladding layer. (It should be noted that the lateral center plane of the light guiding layer structure is indicated by a chain line in FIG. 4.) This results in an improved optical confinement factor (of the fundamental mode) in the active layer and hence a reduced threshold current of the semiconductor laser device. Further, the displacement of the active layer toward the p-type cladding layer makes it possible to increase the slope efficiency and hence the power conversion efficiency of the semiconductor laser device.

It should be noted that although the displacement of the active layer toward the p-type cladding layer also results in an increase in the optical confinement factor of the first and higher order modes, this is not problematic since the increased optical confinement factor of these modes is still typically lower than the optical confinement factor of the fundamental mode. When the optical confinement factor of the fundamental mode is higher than that of the first and higher order modes, high order modes of oscillation do not occur, in which case it is only necessary to consider the optical confinement factor of the fundamental mode.

Third Practical Example of First Embodiment

Figure 6:
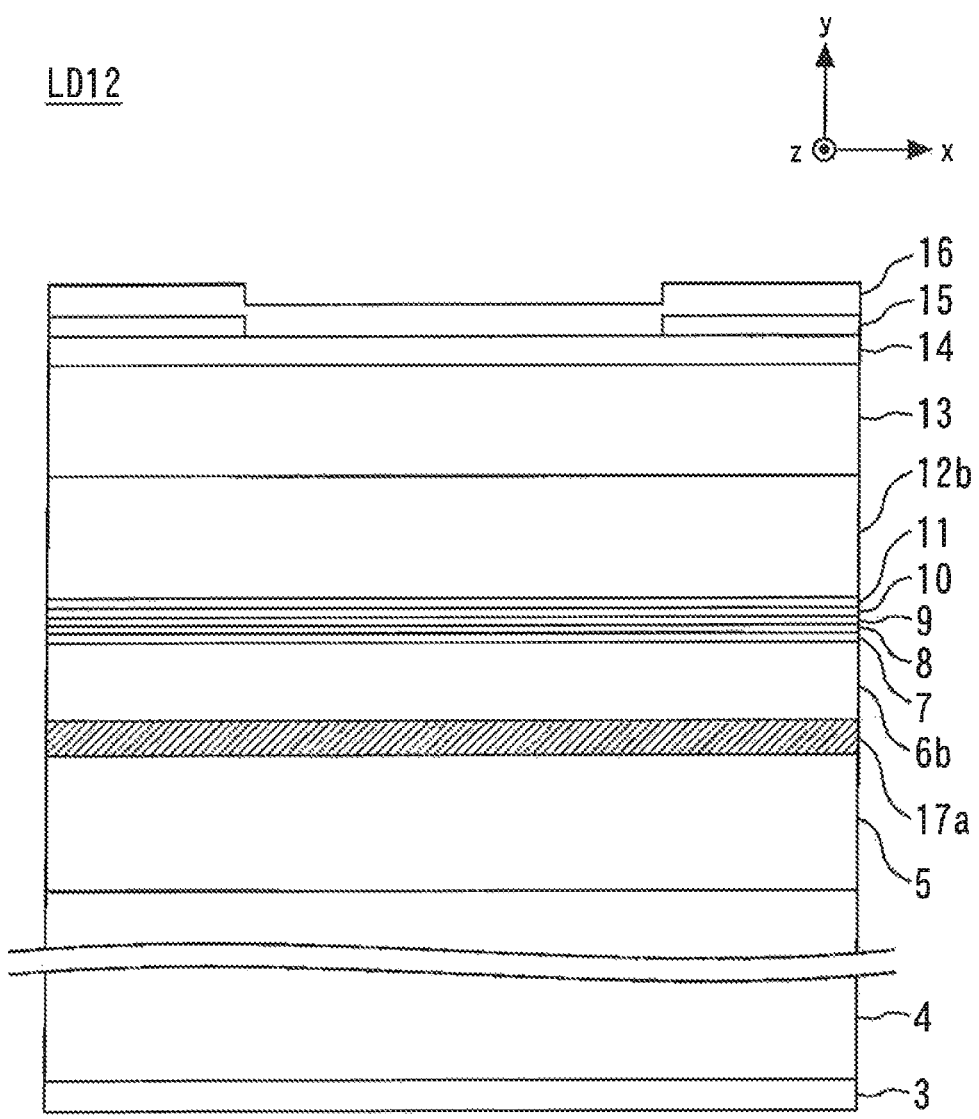
FIG. 6 is a cross-sectional view of a semiconductor laser device in accordance with a third practical example of the first embodiment.

FIG. 6 is a cross-sectional view of a semiconductor laser device LD12 in accordance with a third practical example of the first embodiment. The semiconductor laser device LD12 shown in FIG. 6 differs from the semiconductor laser device LD1 of the first practical example in that it includes an n-side AlGaAs light guiding layer 6b, a p-side AlGaAs light guiding layer 12b, and an n-side AlGaAs low refractive index layer 17a instead of the n-side AlGaAs light guiding layer 6, the p-side AlGaAs light guiding layer 12, and the n-side AlGaAs low refractive index layer 17. The refractive index of the n-side AlGaAs low refractive index layer 17a is any value less than the refractive index of the n-type cladding layer. That is, the low refractive index layer 17a may have an Al mole fraction other than 0.500.

In the third practical example, the n-side AlGaAs light guiding layer 6b and the p-side AlGaAs light guiding layer 12b are configured so that the first and higher order modes of oscillation (in addition to the fundamental mode of oscillation) can occur in the resonator in the crystal growth direction, and the sum of the thicknesses of these light guiding layers is 1000 nm.

Figure 7A:
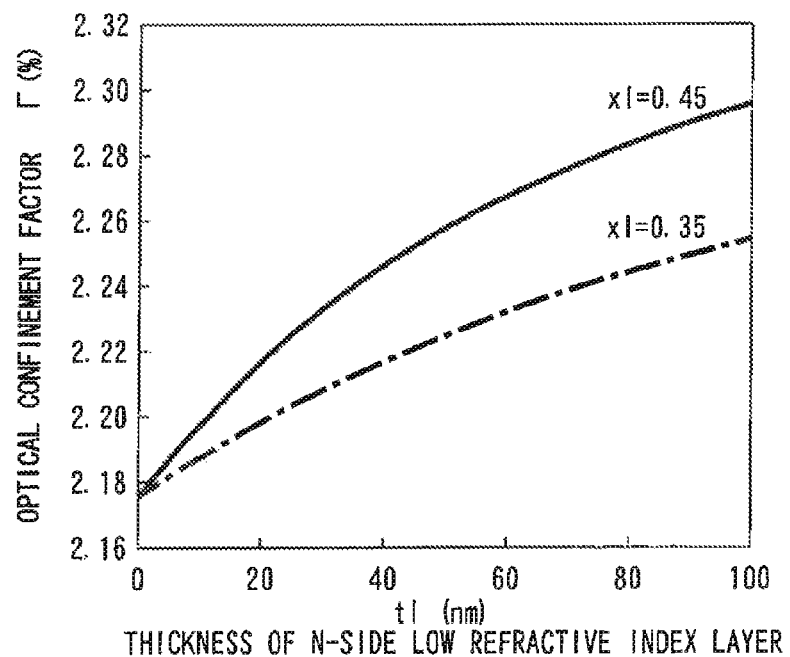
FIG. 7A is a diagram showing a optical confinement factor of the fundamental mode in the active layer of the semiconductor laser device of the third practical example.
Figure 7B:
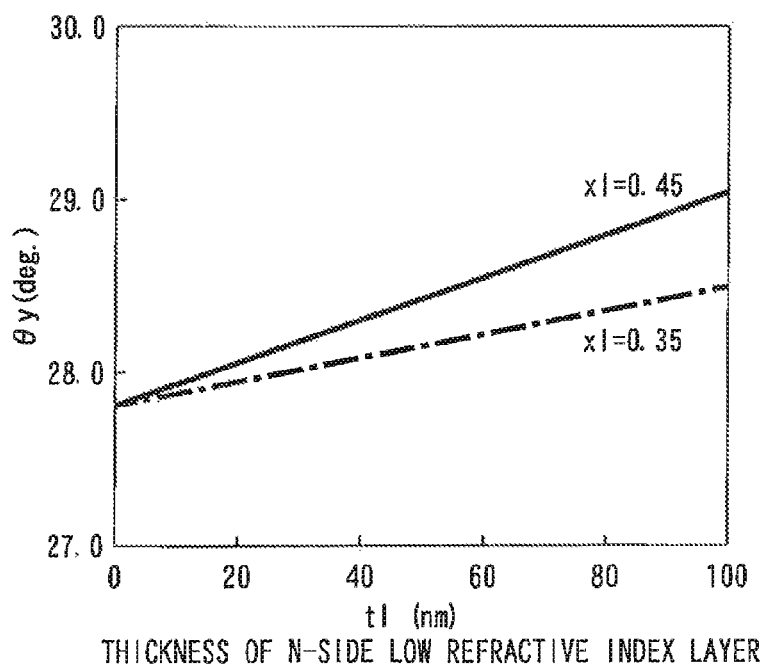
FIG. 7B is a diagram showing a divergence angle (full-width at half-maximum) θy of the far field pattern (FFP) of the semiconductor laser device of the third practical example.

FIG. 7A is a diagram showing how the optical confinement factor of the fundamental mode in the active layer of the semiconductor laser device LD12 of the third practical example depends on the thickness of the n-side AlGaAs low refractive index layer 17a. FIG. 7B is a diagram showing how the divergence angle (full-width at half-maximum) θy of the far field pattern (FFP) of the semiconductor laser device of the third practical example depends on the thickness of the n-side AlGaAs low refractive index layer 17.

Specifically, FIG. 7A shows the optical confinement factor of the fundamental mode in the active layer when the active layer is located in the lateral center plane of the light guiding layer structure, as a function of the thickness of the n-side AlGaAs low refractive index layer 17a for different Al mole fractions of the n-side AlGaAs low refractive index layer 17a. As shown, the optical confinement factor increases with increasing thickness and increasing Al mole fraction of the n-side AlGaAs low refractive index layer 17a.

FIG. 7B shows the divergence angle (full-width at half-maximum) θy of the FFP in the crystal growth direction as a function of the thickness of the n-side AlGaAs low refractive index layer 17a. As shown, the divergence angle θy increases (i.e., the FFP widens) with increasing thickness of the low refractive index layer 17a. It should be noted that the refractive index of an AlGaAs layer is 3.303083 when its Al mole fraction is 0.35, and 3.245653 when its Al mole fraction is 0.45.

Figure 8:
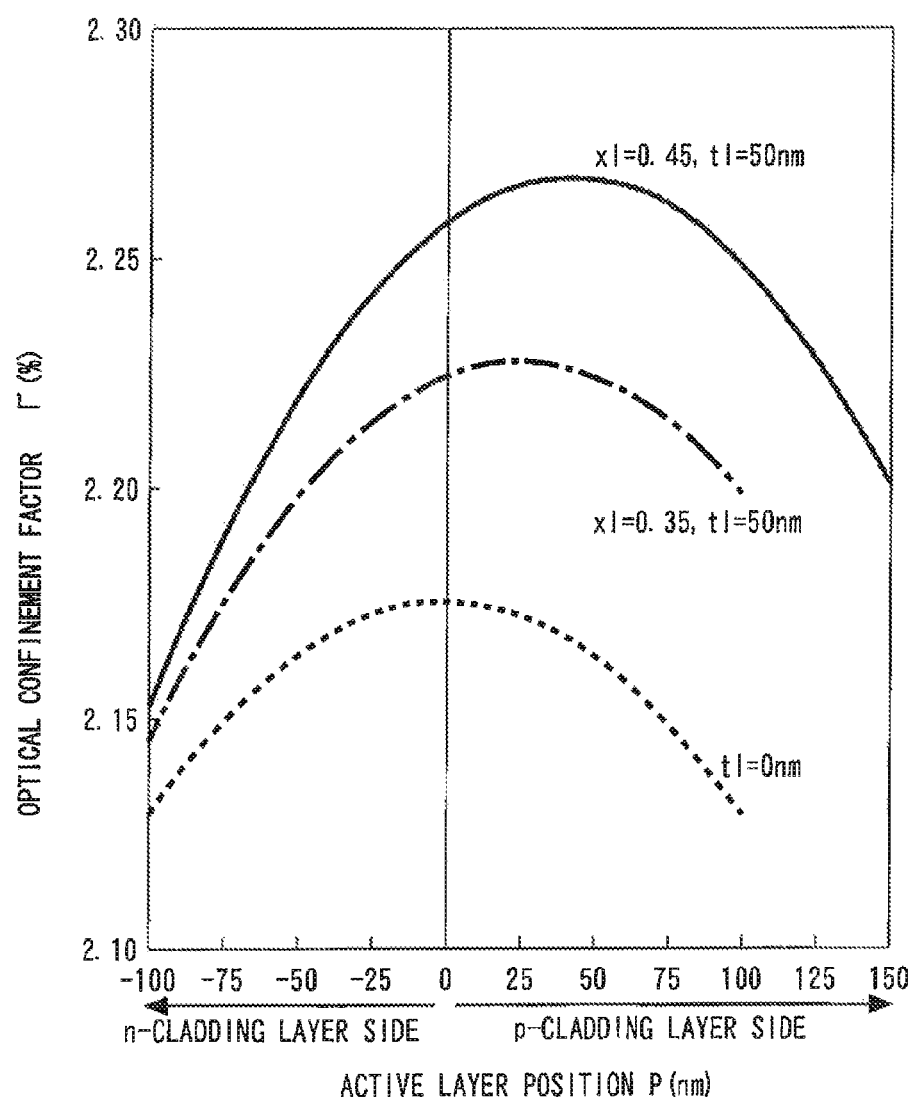
FIG. 8 is a diagram showing how the optical confinement factor of the fundamental mode in the active layer of the semiconductor laser device of the third practical example depends on the position of the active layer.

FIG. 8 is a diagram showing how the optical confinement factor of the fundamental mode in the active layer of the semiconductor laser device LD12 of the third practical example depends on the position of the active layer. Specifically, FIG. 8 shows the optical confinement factor of the fundamental mode in the active layer as a function of the position of the active layer, for different Al mole fractions of the n-side AlGaAs low refractive index layer 17a.

In FIG. 8, the simple dashed line represents the optical confinement factor in the active layer when the n-side AlGaAs low refractive index layer 17a is absent. The chain single-dashed line (or chain line) represents the optical confinement factor when the n-side AlGaAs low refractive index layer 17a has an Al mole fraction of 0.35 and a thickness of 50 nm. The solid line represents the optical confinement factor when the n-side AlGaAs low refractive index layer 17a has an Al mole fraction of 0.45 and a thickness of 50 nm.

As can be seen from FIG. 8, as the Al mole fraction of the low refractive index layer is increased, and hence the refractive index of the low refractive index layer is decreased, the position of the active layer at which the optical confinement factor in the active layer is maximized is displaced toward the p-type cladding layer and furthermore the maximum value of the optical confinement factor is increased. This tendency is present even when the n-side AlGaAs low refractive index layer 17a has a thickness of 100 nm.

As described above, the n-side low refractive index layer provided between the n-type cladding layer and the n-side light guiding layer serves to displace the maximum intensity point of the NFP, or near field intensity profile, from the lateral center plane of the light guiding layer structure toward the p-type cladding layer. Furthermore, this low refractive index layer has the effect of increasing the maximum intensity of the NFP, as compared to when the low refractive index layer is absent, thereby increasing the slope efficiency and reducing the threshold current of the semiconductor laser device.

Comparative Example for Embodiments of the Invention

Configuration of Device of Comparative Example

Figure 15:
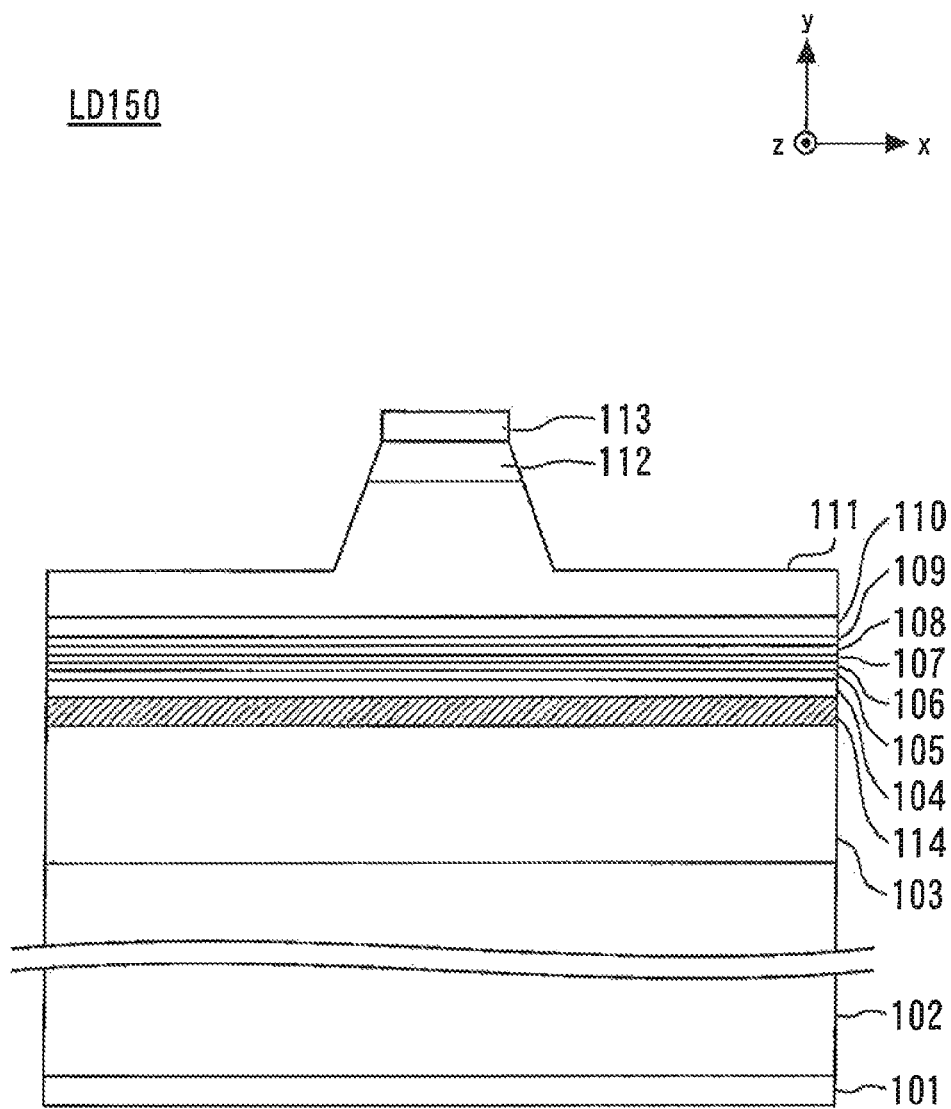
FIG. 15 is a diagram showing a semiconductor laser device, presented as a comparative example for embodiments of the present invention.

FIG. 15 is a diagram showing a semiconductor laser device LD150, presented as a comparative example for embodiments of the present invention. The semiconductor laser device LD150 differs from the semiconductor laser devices of the first embodiment in that only the fundamental mode of oscillation can occur in the resonator.

The semiconductor laser device LD150 includes an n-type GaAs substrate 102 having an n-type electrode 101 formed on its bottom surface. A plurality of semiconductor layers are grown in crystalline form on the n-type GaAs substrate 102. These semiconductor layers include an n-type AlGaAs cladding layer 103, an n-side AlGaAs light guiding layer 104, an n-side AlGaAs barrier layer 105, an InGaAs quantum well layer 106, an AlGaAs barrier layer 107, an InGaAs quantum well layer 108, a p-side AlGaAs barrier layer 109, a p-side AlGaAs light guiding layer 110, a p-type AlGaAs cladding layer 111, and a p-type GaAs contact layer 112. It should be noted that the quantum well layers 106 and 108 and the barrier layers 105, 107, and 109 form an active layer sandwiched between the light guiding layers 104 and 110, and that the light guiding layers 104 and 110 and the active layer form a light guiding layer structure. The thickness of this light guiding layer structure is substantially equal to the sum of the thicknesses of the light guiding layers 104 and 110.

The n-type AlGaAs cladding layer 103 has an Al mole fraction of 0.250 and a thickness of 1.5 µm. The n-side AlGaAs light guiding layer 104 has an Al mole fraction of 0.183 and a thickness of 50 nm. The n-side AlGaAs barrier layer 105 has an Al mole fraction of 0.100 and a thickness 10 nm.

The InGaAs quantum well layer 106 has an In mole fraction of 0.138 and a thickness of 8 nm. The AlGaAs barrier layer 107 has an Al mole fraction of 0.100 and a thickness of 3 nm. The InGaAs quantum well layer 108 has an In mole fraction of 0.138 and a thickness of 8 nm. The p-side AlGaAs barrier layer 109 has an Al mole fraction of 0.100 and a thickness of 10 nm.

The p-side AlGaAs light guiding layer 110 has an Al mole fraction of 0.183 and a thickness of 50 nm. The p-type AlGaAs cladding layer 111 has an Al mole fraction of 0.250 and a thickness of 1.5 µm. The p-type GaAs contact layer 112 has a thickness of 0.2 µm. A p-type electrode 113 is provided on the top of this layer structure.

An n-side AlGaAs low refractive index layer 114 is provided between the n-type AlGaAs cladding layer 103 and the n-side AlGaAs light guiding layer 104. The n-side AlGaAs low refractive index layer 114 has an Al mole fraction of 0.50 and a thickness t1, which is used as a parameter of the graphs shown in FIG. 16 (described later).

Number of Modes in Device of Comparative Example

The v-value of the comparative semiconductor laser device LD150 shown in FIG. 15 will be calculated below using Equation (1) described above. The p-side AlGaAs barrier layer 109, the InGaAs quantum well layer 108, the AlGaAs barrier layer 107, the InGaAs quantum well layer 106, and the n-side AlGaAs barrier layer 105 have a refractive index approximately equal to that of the light guiding layers, which have an Al mole fraction of 0.183. That is, all of these quantum well layers, barrier layers, and light guiding layers are high refractive index layers, and their combined thickness is 139 nm.

A method for determining the refractive index of a semiconductor layer is known (see, e.g., Iga et al., "Semiconductor Laser," pp. 35-38, Oct. 25, 1994, Ohmsha). Using this method, the refractive index of an AlGaAs layer having an Al mole fraction of 0.183 (such as the light guiding layers 104 and 110) is calculated to be 3.403186 at a wavelength of 980 nm. Further, the refractive index of an AlGaAs layer having an Al mole fraction of 0.250 (such as the cladding layers 103 and 111) is calculated to be 3.362125 at a wavelength of 980 nm. Substituting these values into Equation (1) above, the resulting v-value is 0.4697. Thus, since the v-value of the comparative semiconductor laser device is less than $\pi/2$, only the fundamental mode of oscillation can occur in its resonator.

Characteristics of Comparative Example

Figure 16A:
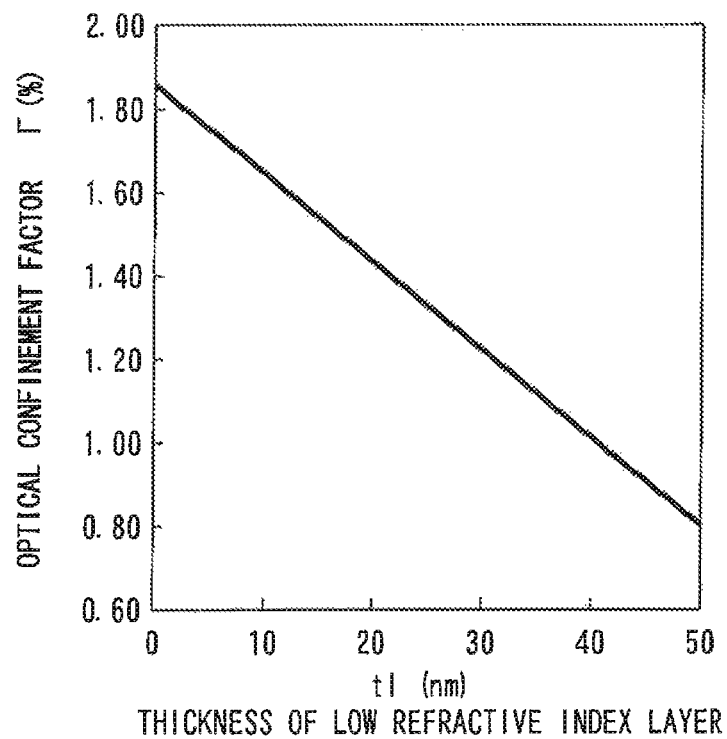
FIG. 16A is a diagram showing a optical confinement factor of the fundamental mode in the active layer of a comparative semiconductor laser device.
Figure 16B:
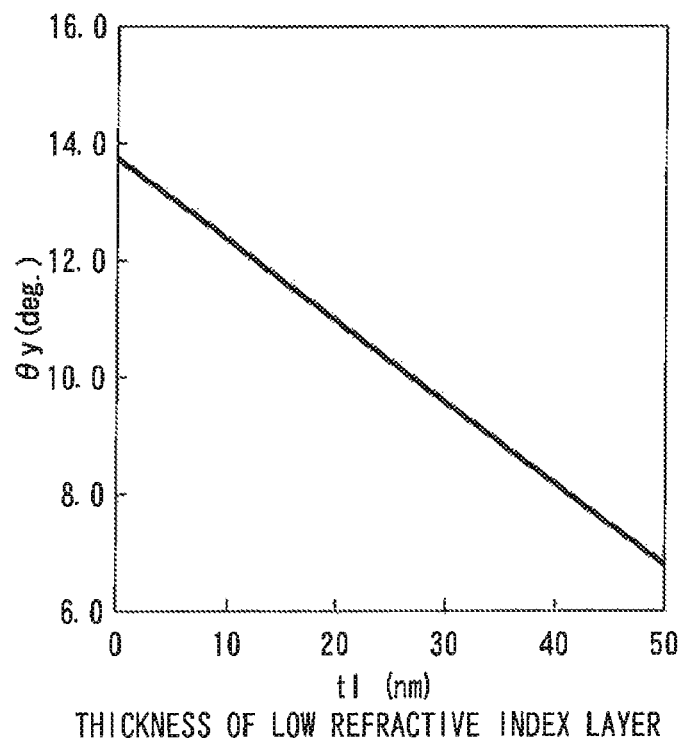
FIG. 16B is a diagram showing a divergence angle (full-width at half-maximum) θy of the far field pattern (FFP) of the comparative semiconductor laser device.

FIG. 16A is a diagram showing how the optical confinement factor of the fundamental mode in the active layer of the comparative semiconductor laser device LD150 depends on the thickness of the n-side AlGaAs low refractive index layer 114. FIG. 16B is a diagram showing how the divergence angle (full-width at half-maximum) $\theta y$ of the far field pattern (FFP) of the comparative semiconductor laser device LD150 depends on the thickness of the n-side AlGaAs low refractive index layer 114.

As shown in FIG. 16A, the optical confinement factor in the active layer gradually decreases with increasing thickness of the low refractive index layer. Further, as shown in FIG. 16B, the divergence angle (full-width at half-maximum) $\theta y$ of the far field pattern (FFP) in the crystal growth direction also gradually decreases with increasing thickness of the low refractive index layer. These characteristics indicate that the near field pattern (NFP), or near field intensity profile, in the crystal growth direction widens with increasing thickness of the low refractive index layer.

Figure 17:
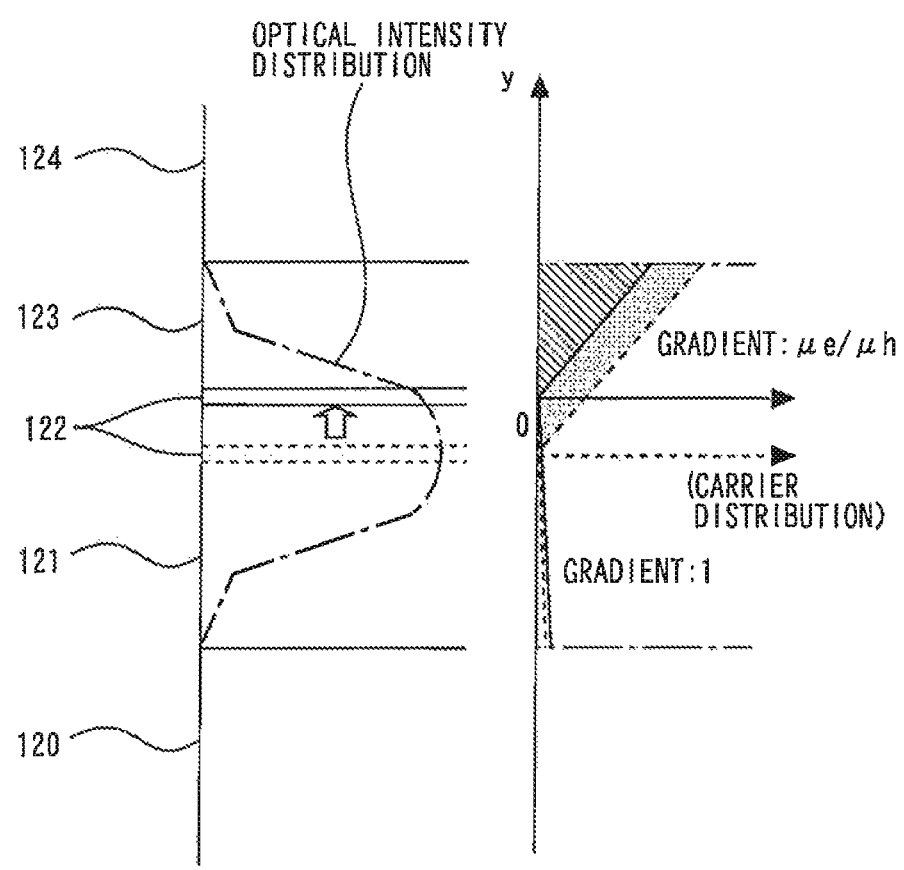
FIG. 17 is a diagram showing the carrier distribution and the optical intensity distribution within the light guiding layers of a semiconductor laser device.

FIG. 17 is a diagram showing the carrier distribution and the optical intensity distribution within the light guiding layers of a semiconductor laser device. The semiconductor laser device shown in FIG. 17 has a layer structure made up of an n-type cladding layer 120, an n-side light guiding layer 121, an active layer 122, a p-side light guiding layer 123, and a p-type cladding layer 124. It should be noted that the n-side light guiding layer 121, the active layer 122, and the p-side light guiding layer 123 together form a light guiding layer structure.

The gradient of the carrier distribution in the p-side light guiding layer is $\mu n/\mu p$ times greater than the gradient of the carrier distribution in the n-side light guiding layer, where $\mu n$ is the mobility of electrons and $\mu p$ is the mobility of holes (see M. Alam and M. Lundstrom, "Simple Analysis of Carrier Transport and Buildup in Separate Confinement Heterostructure Quantum Well lasers," IEEE, Photonics Technol. Lett., Vol. 6, No. 12, pp. 1418-1420, 1994).

The carrier density is the lowest in the light guiding layers near the active layer. Therefore, if the active layer is displaced toward the p-side cladding layer, as indicated by an open arrow in FIG. 17, then the number of carriers in the light guiding layer structure is reduced. This results in reduced carrier absorption of the laser light, making it possible to prevent reduction in the slope efficiency. Therefore, the displacement of the active layer toward the p-type cladding layer is particularly effective with semiconductor laser devices having thick light guiding layers since many carriers are trapped in such light guiding layers during laser oscillation.

However, since the maximum intensity point of the NFP, or near field intensity profile, is located in the lateral center plane of the light guiding layer structure, if the active layer is displaced toward the p-type cladding layer, the optical confinement factor in the active layer is reduced, resulting in an increased threshold current of the semiconductor laser device. However, the displacement of the active layer toward the p-type cladding layer is advantageous when the threshold current is not significant compared to the operating current.

Variations of First Embodiment

Although the present embodiment has been described in connection with semiconductor laser devices in which the barrier layers, the light guiding layers, and the cladding layers are made of AlGaAs, it is to be understood that the present invention is not limited to this semiconductor material. The advantages of the present embodiment described above result from a particular relationship between the refractive indices of a plurality of semiconductor layers. Therefore, a semiconductor laser device formed of other material such as GaN-based, AlGaInP-based, or InP-based material may be configured so that the refractive indices of semiconductor layers have the above particular relationship to achieve the advantages of the first embodiment.

Further, although the semiconductor laser devices of the first embodiment includes an active layer of InGaAs and has a lasing wavelength of 980 nm, it is to be understood that the present invention is not limited to this particular type of semiconductor laser device. The present embodiment may be applied to semiconductor laser devices including an active layer of other semiconductor material and having a lasing wavelength other than 980 nm while retaining the advantages described above in connection with the present embodiment.

Second Embodiment

Configuration of Device of Second Embodiment

Figure 9:
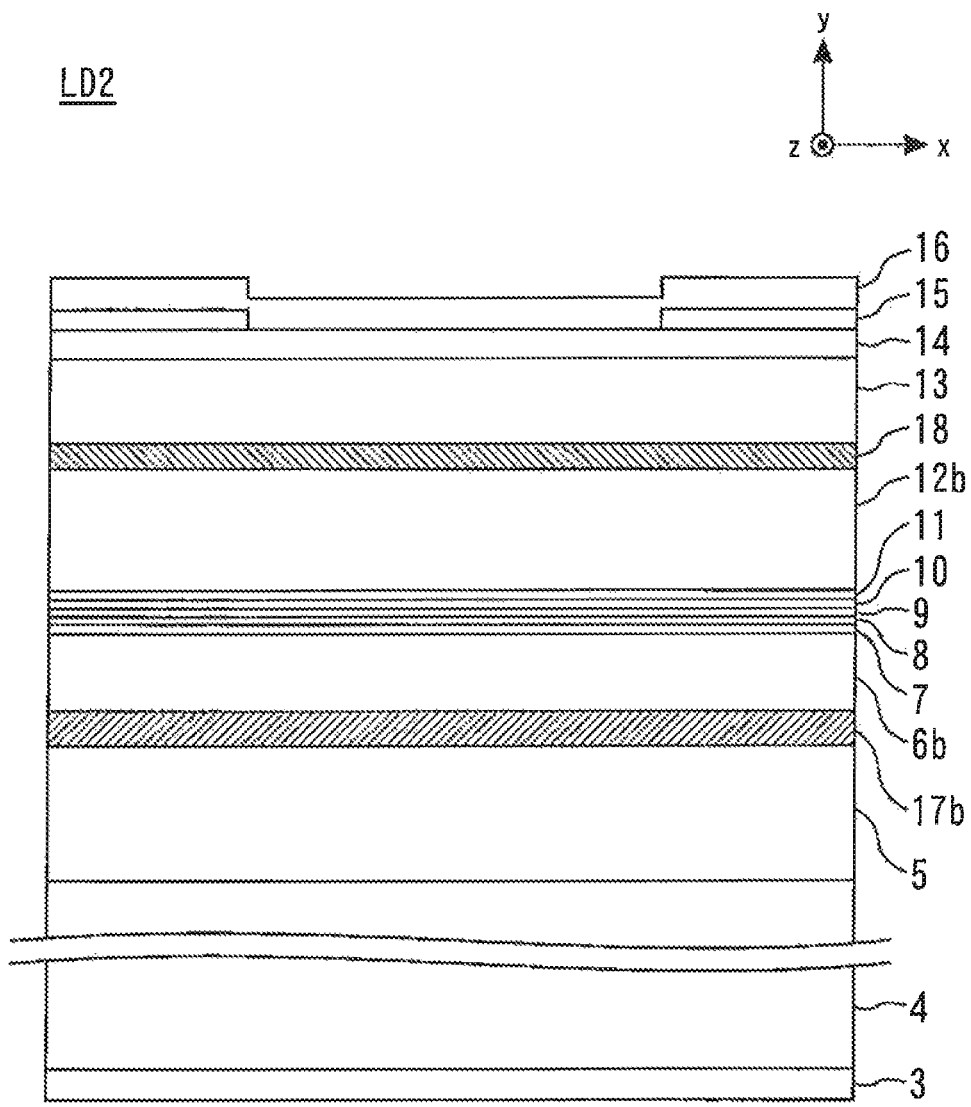
FIG. 9 is a cross-sectional view of a semiconductor laser device in accordance with a second embodiment of the present invention.

FIG. 9 is a cross-sectional view of a semiconductor laser device LD2 in accordance with a second embodiment of the present invention. This semiconductor laser device is similar in configuration to the semiconductor laser device LD12 of the third practical example of the first embodiment shown in FIG. 6, except that it includes an n-side AlGaAs low refractive index layer 17b instead of the n-side AlGaAs low refractive index layer 17a and further includes a p-side AlGaAs low refractive index layer 18. The n-side AlGaAs low refractive index layer 17b has an Al mole fraction of 0.500 and a thickness of 100 nm. The p-side AlGaAs low refractive index layer 18 has an Al mole fraction x1p and a thickness t1p.

The semiconductor laser device LD2 of the second embodiment, configured in the manner described above, is characterized by the following two features:

A first feature is that the p-side AlGaAs low refractive index layer 18, which has a lower refractive index than the p-type AlGaAs cladding layer 13, is disposed between the p-type AlGaAs cladding layer 13 and the p-side AlGaAs light guiding layer 12b.

A second feature is that an n-side design value $v'_n$ is greater than a p-side design value $v'_p$, where: the n-side design value $v'_n$ is the product of the thickness of the n-side low refractive index layer and the square root of the difference between the square of the refractive index of the n-type cladding layer and the square of the refractive index of the n-side low refractive index layer; and the p-side design value $v'_p$ is the product of the thickness of the p-side low refractive index layer and the square root of the difference between the square of the refractive index of the p-type cladding layer and the square of the refractive index of the p-side low refractive index layer.

Operation and Characteristics of Device of Second Embodiment

Figure 10A:
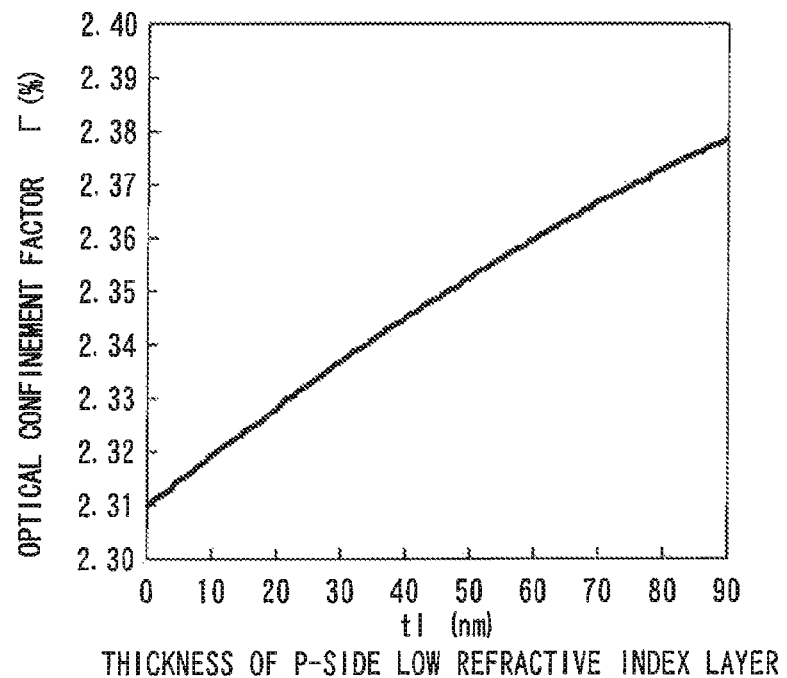
FIG. 10 includes FIGS. 10A and 10B illustrating advantageous characteristics of the semiconductor laser device of the second embodiment.
Figure 10B:
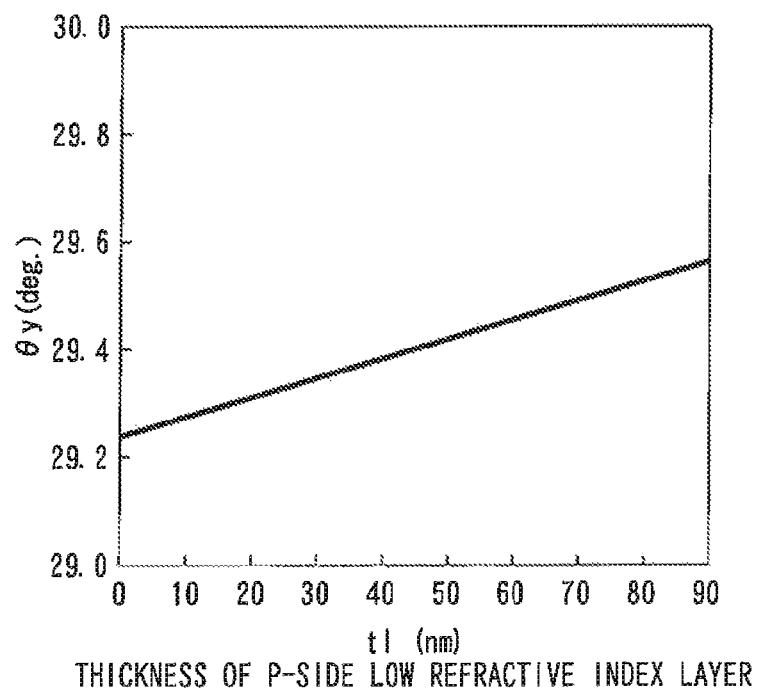

FIG. 10 includes FIGS. 10A and 10B illustrating advantageous characteristics of the semiconductor laser device LD2 of the second embodiment.

FIG. 10A is a diagram showing how the optical confinement factor of the fundamental mode in the active layer of the semiconductor laser device LD2 of the second embodiment depends on the thickness of the p-side AlGaAs low refractive index layer 18. Specifically, FIG. 10A shows the optical confinement factor of the fundamental mode in the active layer when the p-side AlGaAs low refractive index layer 18 has an Al mole fraction x1p of 0.300 and the active layer is located in the lateral center plane of the light guiding layer structure, as a function of the thickness of the p-side AlGaAs low refractive index layer 18. As shown, the optical confinement factor increases with increasing thickness of the p-side AlGaAs low refractive index layer 18.

It should be noted that the n-side AlGaAs low refractive index layer 17b provided between the n-type cladding layer 5 and the n-side AlGaAs light guiding layer 6b has an Al mole fraction of 0.500 and a thickness of 100 nm.

FIG. 10B is a diagram showing how the divergence angle (full-width at half-maximum) θy of the far field pattern (FFP) of the semiconductor laser device LD2 of the second embodiment depends on the thickness of the p-side AlGaAs low refractive index layer 18. Specifically, FIG. 10B shows the divergence angle (full-width at half-maximum) θy of the FFP in the crystal growth direction as a function of the thickness of the p-side AlGaAs low refractive index layer 18. As shown, the divergence angle θy increases (i.e., the FFP widens) with increasing thickness of the p-side AlGaAs low refractive index layer 18. It should be noted that the refractive index of an AlGaAs layer having an Al mole fraction of 0.300 (such as the p-side AlGaAs low refractive index layer 18) is 3.332404.

Figure 11:
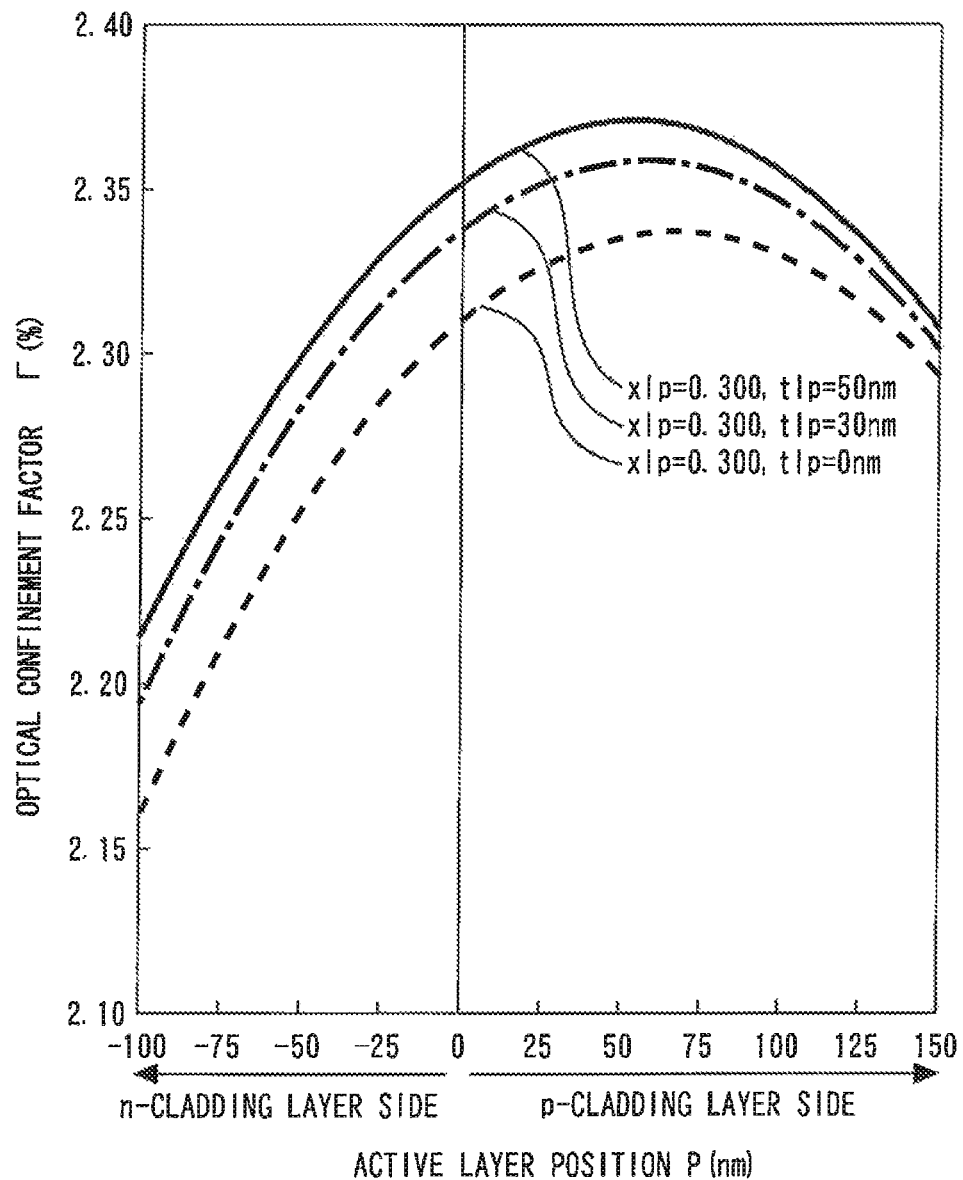
FIG. 11 is a diagram showing how the optical confinement factor of the fundamental mode in the active layer of the semiconductor laser device of the second embodiment depends on the position of the active layer.

FIG. 11 is a diagram showing how the optical confinement factor of the fundamental mode in the active layer of the semiconductor laser device LD2 of the second embodiment depends on the position of the active layer. Specifically, FIG. 11 shows the optical confinement factor of the fundamental mode in the active layer as a function of the position of the active layer, for different thicknesses of the p-side AlGaAs low refractive index layer 18.

In FIG. 11, the simple dashed line represents the optical confinement factor in the active layer when the p-side AlGaAs low refractive index layer 18 is absent. The chain single-dashed line (or chain line) represents the optical confinement factor when the p-side AlGaAs low refractive index layer 18 has an Al mole fraction x1p of 0.300 and a thickness t1p of 30 nm. The solid line represents the optical confinement factor when the p-side AlGaAs low refractive index layer 18 has an Al mole fraction x1p of 0.300 and a thickness t1p of 50 nm.

As shown in FIG. 11, the maximum value of the optical confinement factor increases with increasing thickness of the low refractive index layer 18. Further, as the thickness of the low refractive index layer 18 is increased, the position of the active layer at which the optical confinement factor in the active layer is maximized is displaced slightly further toward the lateral center plane of the light guiding layer structure, but still remains on the p-type cladding layer side of the light guiding layer structure.

These characteristics indicate that it is possible to reduce the threshold current and thereby increase the slope efficiency of the semiconductor laser device by locating the active layer near where the optical confinement factor in the active layer is maximized. It should be noted that the refractive index distribution within the light guiding layer structure becomes more symmetrical as the thickness of the low refractive index layer 18 is increased. This is the reason why the position of the active layer at which the optical confinement factor in the active layer is maximized is displaced further toward the lateral center plane of the light guiding layer structure as the thickness of the low refractive index layer 18 is increased.

The second feature of the semiconductor laser device LD2 of the second embodiment will be described in more detail.

Referring back to FIG. 1 and Equation (1) described in connection with the first embodiment, the optical confinement factor in the high refractive index region (or layer) 2 is determined by the product of the thickness of the high refractive index region 2 and the value of $(n_1^2-n_2^2)^{1/2}$, where $n_1$ is the refractive index of the high refractive index region 2 and $n_2$ is the refractive index of the low refractive index regions 1 and 1a (see FIG. 1). It should be noted that the high refractive index region 2 corresponds to the light guiding layer structure of the semiconductor laser device LD2 of the second embodiment (including the n-side and p-side light guiding layers 6b and 12b and the active layer), and the low refractive index regions 1 and 1a correspond to the n-type and p-type cladding layers 5 and 13, respectively.

Further, in the semiconductor laser device LD2 of the second embodiment, the n-side low refractive index layer 17b functions such that the position of the active layer at which the optical confinement factor in the active layer is maximized is displaced toward the p-type cladding layer 13. The amount of displacement is found to be dependent on the refractive index and the thickness of the low refractive index layer 17b, as is the case with the low refractive index layer 17 of the semiconductor laser device LD11 of the first embodiment described above with reference to FIG. 5.

The semiconductor laser device LD2 of the second embodiment is further provided with the p-side low refractive index layer 18, which is considered to function such that the position of the active layer at which the optical confinement factor in the active layer is maximized is displaced toward the n-type cladding layer 5. The amount of this displacement is considered to be dependent on the refractive index and the thickness of the p-side low refractive index layer 18, as is the case with the n-side low refractive index layer 17b.

Since the position of the active layer at which the optical confinement factor in the active layer is maximized must be located on the p-type cladding layer 13 side (or upper side) of the light guiding layer structure, the refractive indices and the thicknesses of the n-side and p-side low refractive index layers 17b and 18 and the refractive indices of the n-type and p-type cladding layers 5 and 13 must be selected so that the amount of displacement toward the p-type cladding layer 13 caused by the n-side low refractive index layer 17b is greater than the amount of displacement toward the n-type cladding layer 5 caused by the p-side low refractive index layer 18. In order to achieve this, the n-side design value $v'_n$ must be greater than the p-side design value $v'_p$, as described above.

The n-side design value $v'_n$ is given by Equation (2) below.

$$v'_n = (n_{1n}^2 - n_{2n}^2)^{1/2} \times T_n \quad (2)$$

where $n_{1n}$ is the refractive index of the n-type AlGaAs cladding layer 5, $n_{2n}$ is the refractive index of the n-side AlGaAs low refractive index layer 17b, and $T_n$ is the thickness of the n-side AlGaAs low refractive index layer 17b.

The p-side design value $v'_p$ is given by Equation (3) below.

$$v'_p = (n_{1p}^2 - n_{2p}^2)^{1/2} \times T_p \quad (3)$$

where $n_{1p}$ is the refractive index of the p-type AlGaAs cladding layer 13, $n_{2p}$ is the refractive index of the p-side AlGaAs low refractive index layer 18, and $T_p$ is the thickness of the p-side AlGaAs low refractive index layer 18.

As a result of the second feature described above, the position of the active layer at which the optical confinement factor in the active layer is maximized is displaced from the lateral center plane of the light guiding layer structure toward the p-type cladding layer 13.

The semiconductor laser device LD2 of the second embodiment described above has both an n-side low refractive index layer interposed between the n-type cladding layer and the n-side light guiding layer and a p-side low refractive index layer interposed between the p-type cladding layer and the p-side light guiding layer. Further, the semiconductor laser device LD2 is configured to have the second feature described above.

The n-side and p-side low refractive index layers are configured so that the maximum intensity point in the light guiding layer structure is displaced from the lateral center plane of the light guiding layer structure toward the p-type cladding layer, and so that the maximum intensity of the NFP is higher than would be the case if these low refractive index layers were absent. This results in increased slope efficiency and a decreased threshold current of the semiconductor laser device LD2.

Third Embodiment

Configuration of Device of Third Embodiment

Figure 12:
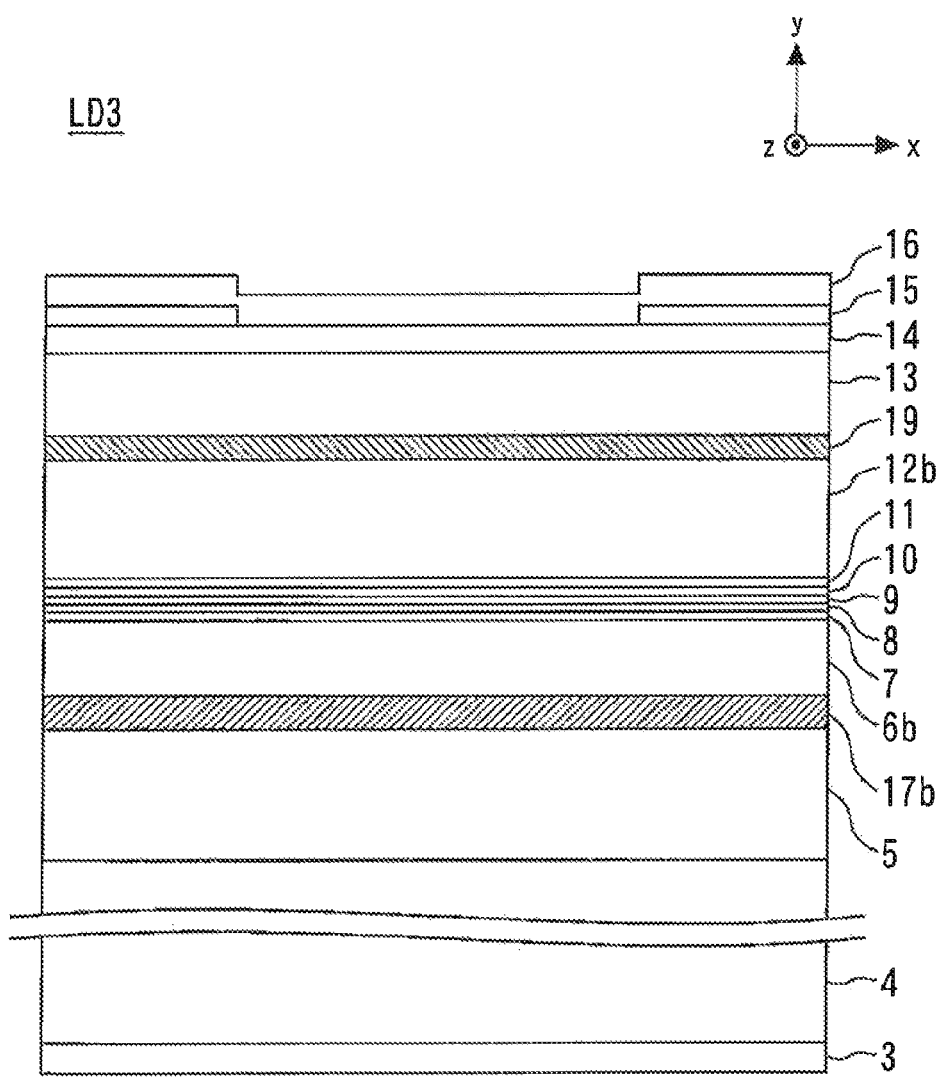
FIG. 12 is a cross-sectional view of a semiconductor laser device in accordance with a third embodiment of the present invention.

FIG. 12 is a cross-sectional view of a semiconductor laser device LD3 in accordance with a third embodiment of the present invention. The semiconductor laser device LD3 of the third embodiment differs from the semiconductor laser device LD2 of the second embodiment in that the p-side AlGaAs low refractive layer 18 is replaced by a p-side AlGaAs high refractive index layer 19 having a refractive index lower than that of the active layer but higher than that of the p-side AlGaAs light guiding layer 12b. That is, in the semiconductor laser device LD3, the n-side AlGaAs low refractive index layer 17b is provided between the n-type AlGaAs cladding layer 5 and the n-side AlGaAs light guiding layer 6b (as in the second embodiment), and the p-side AlGaAs high refractive index layer 19 is provided between the p-type AlGaAs cladding layer 13 and the p-side AlGaAs light guiding layer 12b.

The p-side AlGaAs high refractive index layer 19 has an Al mole fraction of 0.120 and a thickness of 20 nm. It should be noted that an AlGaAs layer having an Al mole fraction of 0.120 has a refractive index of 3.442407. Thus, the semiconductor laser device LD3 has a layer structure similar to that of the semiconductor laser device LD2 shown in FIG. 9, except that it has the p-side AlGaAs high refractive index layer 19 instead of the p-side AlGaAs low refractive index layer 18.

Operation and Characteristics of Device of Third Embodiment

Figure 13:
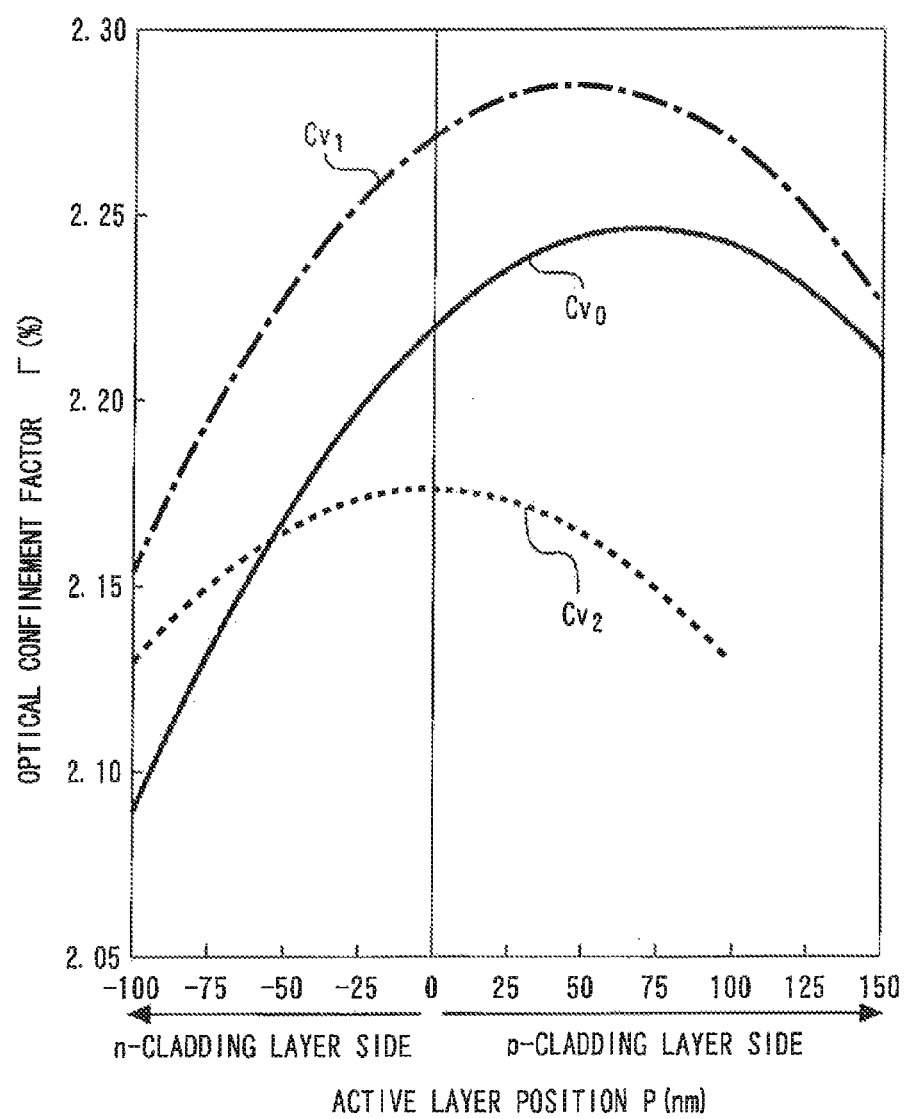
FIG. 13 is a diagram showing how the optical confinement factor of the fundamental mode in the active layer of the semiconductor laser device of the third embodiment depends on the position of the active layer.

FIG. 13 is a diagram showing how the optical confinement factor of the fundamental mode in the active layer of the semiconductor laser device LD3 of the third embodiment depends on the position of the active layer.

In FIG. 13, simple dashed line curve Cv2, which is shown for reference purposes only, represents the optical confinement factor in the active layer of the semiconductor laser device LD3 when the n-side AlGaAs low refractive index layer 17b and the p-side AlGaAs high refractive index layer 19 are absent. Chain single-dashed line (or chain line) curve Cv1, which is shown for reference purposes only, represents the optical confinement factor when the n-side AlGaAs low refractive index layer 17b (having an Al mole fraction of 0.500 and a thickness of 50 nm) is present but the p-side AlGaAs high refractive index layer 19 is absent.

Solid line curve Cv0 represents the optical confinement factor when both the n-side AlGaAs low refractive index layer 17b (having an Al mole fraction of 0.500 and a thickness of 50 nm) and the p-side AlGaAs high refractive index layer 19

(having an Al mole fraction of 0.120 and a thickness of 20 nm) are present. When both the n-side AlGaAs low refractive index layer 17b and the p-side AlGaAs high refractive index layer 19 are present, the maximum intensity point in the light guiding layer structure is displaced toward the p-type AlGaAs cladding layer 13 further than when the n-side AlGaAs low refractive index layer 17b is present but the p-side AlGaAs high refractive index layer 19 is absent, although the value of the maximum intensity is lower.

When both the n-side AlGaAs low refractive index layer 17b and the p-side AlGaAs high refractive index layer 19 are present, the semiconductor laser device LD3 has higher slope efficiency than when the n-side AlGaAs low refractive index layer 17b is present but the p-side AlGaAs high refractive index layer 19 is absent, since the position of the active layer at which the optical confinement factor in the active layer is maximized is displaced further toward the p-type AlGaAs cladding layer 13, although the semiconductor laser device LD3 exhibits a higher threshold current. Further, as can be seen from FIG. 13, the semiconductor laser device LD3 has a lower threshold current and higher slope efficiency when the n-side AlGaAs low refractive index layer 17 and the p-side AlGaAs high refractive index layer 19 are present than when both of them are absent.

When the active layer is located in the lateral center plane of the light guiding layer structure, the divergence angle (full-width at half-maximum) θy of the FFP in the crystal growth direction varies according to the presence or absence of the n-side AlGaAs low refractive index layer 17 and the p-side AlGaAs high refractive index layer 19 as follows: when both the n-side low refractive index layer and the p-side AlGaAs high refractive index layer are absent, the divergence angle θy is 27.8°; when the n-side AlGaAs low refractive index layer is present but the p-side AlGaAs high refractive index layer is absent, θy is 28.6°; and when both the n-side low refractive index layer and the p-side AlGaAs high refractive index layer are present, θy is 28.6°. Thus, even when the p-side AlGaAs high refractive index layer (in addition to the n-side AlGaAs low refractive index layer) is present, the divergence angle θy is greater than (that is, the FFP is wider than) when both layers are absent.

The semiconductor laser device LD3 of the third embodiment described above has both an n-side low refractive index layer provided between the n-type cladding layer and the n-side light guiding layer and a p-side high refractive index layer provided between the p-type cladding layer and the p-side light guiding layer.

The n-side low refractive index layer and the p-side high refractive index layer are configured so that the maximum intensity point in the light guiding layer structure is displaced from the lateral center plane of the light guiding layer structure toward the p-type cladding layer, and so that the maximum intensity of the NFP is higher than would be the case if both the n-side low refractive index layer and the p-side high refractive index layer were absent. This results in increased slope efficiency and a decreased threshold current of the semiconductor laser device LD3.

Fourth Embodiment

Figure 14:
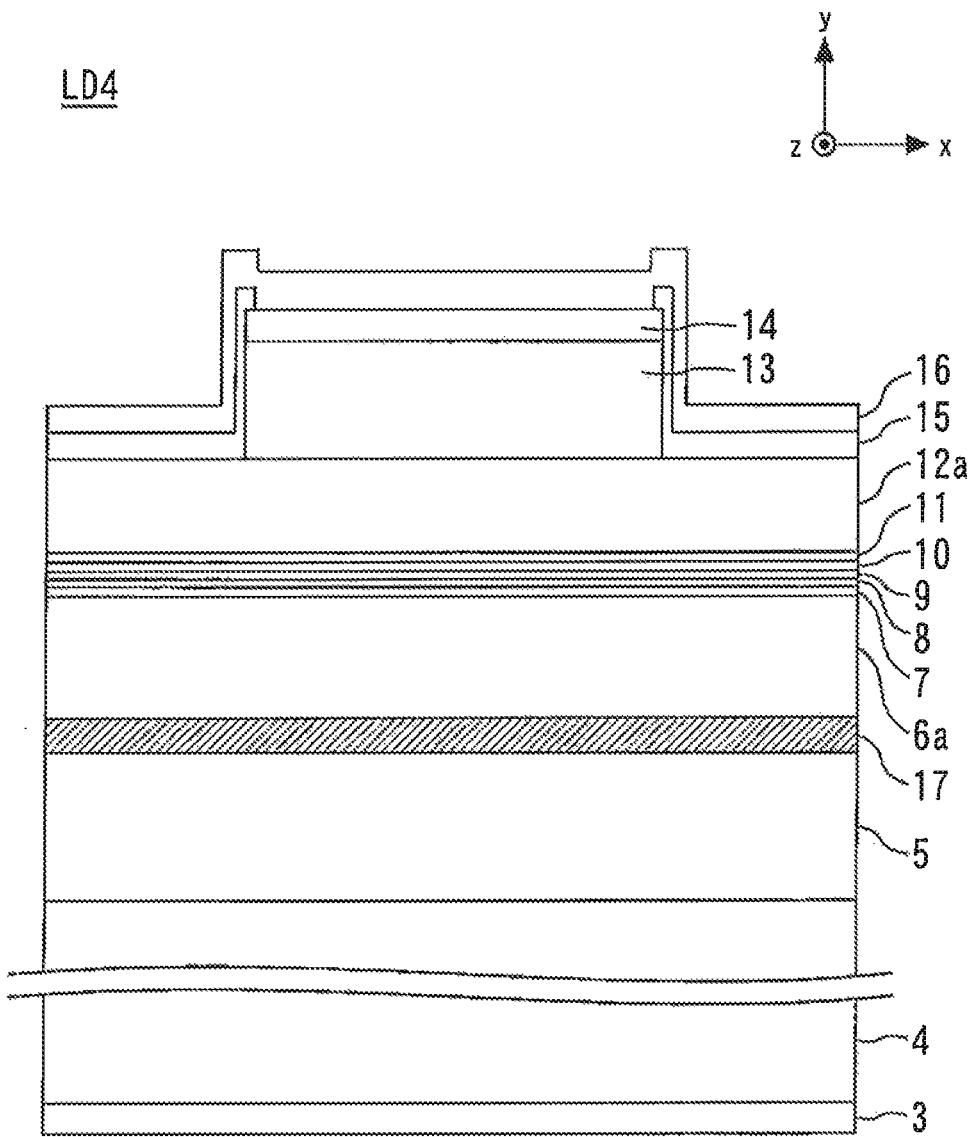
FIG. 14 is a cross-sectional view of a semiconductor laser device in accordance with a fourth embodiment of the present invention.

FIG. 14 is a cross-sectional view of a semiconductor laser device LD4 in accordance with a fourth embodiment of the present invention. The semiconductor laser device LD4 is a ridge semiconductor laser device formed by etching away side edges of the p-type GaAs contact layer and the p-type AlGaAs cladding layer at the top of a semiconductor laser structure and thereby producing a ridge formed of the remaining central portions of the contact layer and the cladding layer.

Thus, the p-type contact layer and p-type cladding layer is reduced in width by etching, and together form a ridge extending along the length of the resonator (i.e., in the z direction in FIG. 14). As a result, the current flowing through the p-type contact layer and the p-type cladding layer to the active layer is restricted from spreading in the x direction. This results in a decreased threshold current of the semiconductor laser device.

It should be noted that although in the present embodiment the above etching for forming the ridge is stopped when the p-type cladding layer has been etched through its thickness, it is to be understood that in other embodiments the etching may be stopped when a depth halfway through the p-type cladding layer or halfway through the p-type light guiding layer 12a has been reached. Alternatively, only the contact layer may be etched.

As described above, the semiconductor laser device LD4 of the fourth embodiment has a ridge structure. This ridge structure has the effect of restricting the current flowing therethrough from spreading in a direction perpendicular to both the crystal growth direction and the resonator length direction, thereby reducing the threshold current of the semiconductor laser device LD4.

The features and advantages of the present invention may be summarized as follows. The semiconductor laser devices of the present invention are configured to have a low threshold current, high slope efficiency, and high power conversion efficiency.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2013-072302, filed on Mar. 29, 2013, including specification, claims, drawings, and summary, on which the Convention priority of the present application is based, is incorporated herein by reference in its entirety.

The invention claimed is:

1. A semiconductor laser device comprising:
a semiconductor substrate of a first conductivity type;
a cladding layer of the first conductivity type laminated on the semiconductor substrate;
a first light guiding layer laminated on the cladding layer of the first conductivity type;
an active layer laminated on the first light guiding layer;
a second light guiding layer laminated on the active layer;
a cladding layer of a second conductivity type laminated on the second light guiding layer, wherein
the sum of thickness of the first light guiding layer and thickness of the second light guiding layer is such that first and higher order vertical modes of oscillation, in a direction of crystal growth of the first light guiding layer and the second light guiding layer, are supported, and
the thickness of the first light guiding layer is larger, than the thickness of the second light guiding layer; and
a first low refractive index layer having a refractive index lower than refractive index of the cladding layer of the first conductivity type and located between the cladding layer of the first conductivity type and the first light guiding layer.

2. The semiconductor laser device according to claim 1, wherein the cladding layer of the second conductivity type includes a ridge portion.

* * * * *